(12) United States Patent
Van Overbeek et al.

(10) Patent No.: US 12,484,489 B2
(45) Date of Patent: Dec. 2, 2025

(54) LUMINESCENT GREENHOUSE GLAZING STRUCTURES

(71) Applicant: PHYSEE GROUP B.V., Delft (NL)

(72) Inventors: Sadiq Van Overbeek, Delft (NL); Chung-che Kao, Delft (NL); Sicco Henricus Godefridus Peeters, Delft (NL); Ana Jung, Delft (NL); Chao-Chun Hsu, Delft (NL)

(73) Assignee: PHYSEE GROUP B.V., Delft (NL)

( * ) Notice: Subject to any disclaimer, the term of this patent is extended or adjusted under 35 U.S.C. 154(b) by 997 days.

(21) Appl. No.: 17/626,279

(22) PCT Filed: Jul. 13, 2020

(86) PCT No.: PCT/EP2020/069806
§ 371 (c)(1),
(2) Date: Jan. 11, 2022

(87) PCT Pub. No.: WO2021/009144
PCT Pub. Date: Jan. 21, 2021

(65) Prior Publication Data
US 2022/0256777 A1     Aug. 18, 2022

(30) Foreign Application Priority Data
Jul. 12, 2019   (NL) ..................................... 2023498

(51) Int. Cl.
*A01G 9/14* (2006.01)
*A01G 9/20* (2006.01)
(Continued)

(52) U.S. Cl.
CPC ................ *A01G 9/14* (2013.01); *B32B 17/00* (2013.01); *C03C 17/00* (2013.01); *C03C 17/007* (2013.01);
(Continued)

(58) Field of Classification Search
None
See application file for complete search history.

(56) References Cited

U.S. PATENT DOCUMENTS

| 7,536,834 B2 | 5/2009 | Blanc et al. |
| 8,314,546 B2 | 11/2012 | Tchakarov |

(Continued)

FOREIGN PATENT DOCUMENTS

| CN | 101629077 A | 1/2010 |
| CN | 101787272 A | 7/2010 |

(Continued)

OTHER PUBLICATIONS

Wiley, Thin-film Coatings: Understanding key design principles of antireflection coatings, https://www.laserfocusworld.com /optics/ article /16547029/ thin-film-coatings-understanding-key-design-principles-of-antireflection-coatings 2016. (Year: 2016).*

(Continued)

*Primary Examiner* — David Sample
(74) *Attorney, Agent, or Firm* — MENDELSOHN DUNLEAVY P.C.; Kevin J. Dunleavy

(57) ABSTRACT

Luminescent greenhouse glazing structures are described wherein the glazing structures comprise: a glass pane for a greenhouse; and, one or more $Eu^{2+}$ doped amorphous inorganic luminescent thin film layers provided over the glass pane, wherein the one or more $Eu^{2+}$ doped amorphous inorganic luminescent layers comprise or consist essentially of the elements Al and/or Si and the elements O and/or N; and, wherein the Si concentration is selected between 0 and 45 at. %, the Al concentration between 0 and 50 at. %, the O concentration between 0 and 70 at. %, the N concentration between 0 and 60 at. % and the $Eu^{2+}$ between 0.01 and 30 at. %.

23 Claims, 15 Drawing Sheets

(51) Int. Cl.

| | | |
|---|---|---|
| *B32B 17/00* | (2006.01) | |
| *C03C 17/00* | (2006.01) | |
| *C08J 5/18* | (2006.01) | |
| *C08K 9/04* | (2006.01) | |
| *C09D 5/22* | (2006.01) | |
| *C09D 7/20* | (2018.01) | |
| *C09D 7/40* | (2018.01) | |
| *C09D 7/62* | (2018.01) | |
| *C09K 11/00* | (2006.01) | |
| *C09K 11/02* | (2006.01) | |
| *C09K 11/77* | (2006.01) | |
| *G02B 1/115* | (2015.01) | |
| *G02B 5/02* | (2006.01) | |

(52) U.S. Cl.
CPC ............... *C03C 17/009* (2013.01); *C08J 5/18* (2013.01); *C08K 9/04* (2013.01); *C09D 5/22* (2013.01); *C09D 7/20* (2018.01); *C09D 7/62* (2018.01); *C09D 7/67* (2018.01); *C09K 11/00* (2013.01); *C09K 11/025* (2013.01); *C09K 11/77347* (2021.01); *C09K 11/77348* (2021.01); *G02B 1/115* (2013.01); *G02B 5/021* (2013.01); *A01G 2009/1484* (2013.01); *A01G 9/20* (2013.01); *C03C 2217/445* (2013.01); *C03C 2217/475* (2013.01); *C03C 2217/48* (2013.01); *C08K 2201/011* (2013.01)

(56) References Cited

U.S. PATENT DOCUMENTS

| | | |
|---|---|---|
| 2005/0001225 A1 | 1/2005 | Yoshimura et al. |
| 2006/0168905 A1 | 8/2006 | Blanc et al. |
| 2008/0258602 A1 | 10/2008 | Masuda et al. |
| 2009/0278448 A1 | 11/2009 | Tchakarov |
| 2010/0102251 A1 | 4/2010 | Ferrini et al. |
| 2010/0309647 A1 | 12/2010 | Winkler et al. |
| 2011/0090683 A1 | 4/2011 | Petry et al. |
| 2011/0149550 A1 | 6/2011 | Jermann et al. |
| 2012/0057337 A1 | 3/2012 | Liebald et al. |
| 2012/0247009 A1* | 10/2012 | Chuang ............... A01G 9/243 47/17 |
| 2013/0194669 A1 | 8/2013 | De Waele et al. |
| 2014/0355106 A1 | 12/2014 | Laluet et al. |
| 2017/0139109 A1 | 5/2017 | Gierens et al. |
| 2017/0288080 A1 | 10/2017 | Carter et al. |
| 2017/0369774 A1 | 12/2017 | He et al. |
| 2018/0074251 A1 | 3/2018 | Berard et al. |

FOREIGN PATENT DOCUMENTS

| | | |
|---|---|---|
| CN | 102061166 A | 5/2011 |
| CN | 102701745 A | 10/2012 |
| CN | 102765942 A | 11/2012 |
| CN | 103998236 A | 8/2014 |
| CN | 105331361 A | 2/2016 |
| CN | 105682451 A | 6/2016 |
| CN | 105917474 A | 8/2016 |
| CN | 106893584 A | 6/2017 |
| EP | 2437315 A2 | 4/2012 |
| EP | 2618041 A1 | 7/2013 |
| JP | 2001-270733 A | 10/2001 |
| JP | 2008-181771 A | 8/2008 |
| JP | 2009-533808 A | 9/2009 |
| JP | 2012-109 A | 1/2012 |
| JP | 2012-199078 A | 10/2012 |
| JP | 2017-523463 A | 8/2017 |
| JP | 2018-518796 A | 7/2018 |
| NL | 1017077 C1 | 7/2002 |
| NL | 2002577 C2 | 8/2010 |
| RU | 2459855 C2 | 8/2012 |
| WO | 2016020337 A1 | 2/2016 |
| WO | 2018169404 A1 | 9/2018 |
| WO | 2019020598 A2 | 1/2019 |

OTHER PUBLICATIONS

Hou et al., "Photoluminescence behavior and thermal stability of Eu-doped SiAlON thin films prepared by RF magnetron co-sputtering of SiAlON and Eu2O3 targets," Functional Materials Letters, vol. 11, No. 4 (2018) 1850086 (6 pages). (Year: 2018).*

DeBoer et al., "Progress in phosphors and filters for luminescent solar concentrators," published Mar. 29, 2012 May 7, 2012 / vol. 20, No. 83 / Optics Express A395 (Year: 2012).*

Office Action for Russian application No. 2022101650; dated Jun. 24, 2024 (14 pages).

Papulov Yu.G., "The Relationship Between the Properties of Substances and the Structure of Molecules: Mathematical Modeling" Successes of Modern Natural Science 2 (2006): 75-76.

Kazankin O.N. et al., "Inorganic luminophores." Leningrad: Chemistry (1975): 7-9.

Notice of Reasons for Refusal for corresponding Japanese application No. 2022-502015; dated Apr. 5, 2024 (16 pages).

Request for Submission of Opinion for corresponding Korean application No. 10-2022-7004392; dated Sep. 9, 2024 (20 pages) Machine Translation.

First Office Action for corresponding Chinese application No. 2020800632255; dated Mar. 9, 2023 (11 pages).

First Office Action for corresponding Chinese application No. 2020800632306; dated Jun. 27, 2023 (12 pages).

Notice of Reasons for Rejection for corresponding Japanese application No. 2022-502016; dated Jul. 3, 2024 (17 pages).

Final Office Action for U.S. Appl. No. 17/626,269; dated Jun. 21, 2024 (17 pages).

Notice of Allowance for U.S. Appl. No. 17/626,269; dated Aug. 28, 2024 (8 pages).

Request for Submission of Opinion for corresponding Korean application No. 10-2022-7004391; dated Sep. 5, 2024 (19 pages) Machine Translation.

Office Action for corresponding Russian application No. 2022101650; dated Dec. 8, 2023 (14 pages).

Non-Final Office Action for U.S. Appl. No. 17/626,269; dated Nov. 1, 2023 (15 pages).

International Search Report and Written Opinion for corresponding International application No. PCT/EP2020/069807; dated Sep. 23, 2020 (14 pages).

Kurita, M., et al. "Optical Surface Roughness Measurement From Scattered Light Approximated by Two-dimensional Gaussian Function." Transactions on Engineering Sciences, WIT Press, vol. 2 (1993): 1-10.

Barranco, Ángel, et al. "Room temperature synthesis of porous SiO2 thin films by plasma enhanced chemical vapor deposition." Journal of Vacuum Science and Technology A, 22.4 (2004): 1275-1284.

Cho, Yujin, et al. "Low-energy Cathodoluminescence for (Oxy)Nitride Phosphors." Journal of Visualized Experiments: JoVE 117.e54249 (2016): 1-11.

Dedoncker, Robin, et al. "Sputter deposition of porous thin films from metal/NaCl powder targets." Applied Physics Letters 115.4 Article 041601 (2019): 1-5.

Kim, Kyeonghun, et al. "Anti-reflection porous SiO2 thin film deposited using reactive high-power impulse magnetron sputtering at high working pressure for use in a-Si:H solar cells." Solar Energy Materials & Solar Cells 130 (2014): 582-586.

Lunt, Richard R., et al. "Transparent, near-infrared organic photovoltaic solar cells for window and energy-scavenging applications." Applied Physics Letters 98.113305 (2011): 1-4.

Merkx, Evert, et al. "Functionalizing window coatings with luminescence centers by combinatorial sputtering of scatter-free amorphous SiAlON:Eu2+ thin film composition libraries." Journal of Luminescence 208 (2019): 51-56.

Tian, Zhen, et al. "Daylight luminous environment with prismatic film glazing in deep depth manufacture buildings." Building Simulation 12.1, Tsinghua University Press (2019): 129-140.

(56) References Cited

OTHER PUBLICATIONS

International Search Report and Written Opinion for corresponding International application No. PCT/EP2020/069806; dated Sep. 18, 2020 (12 pages).

* cited by examiner

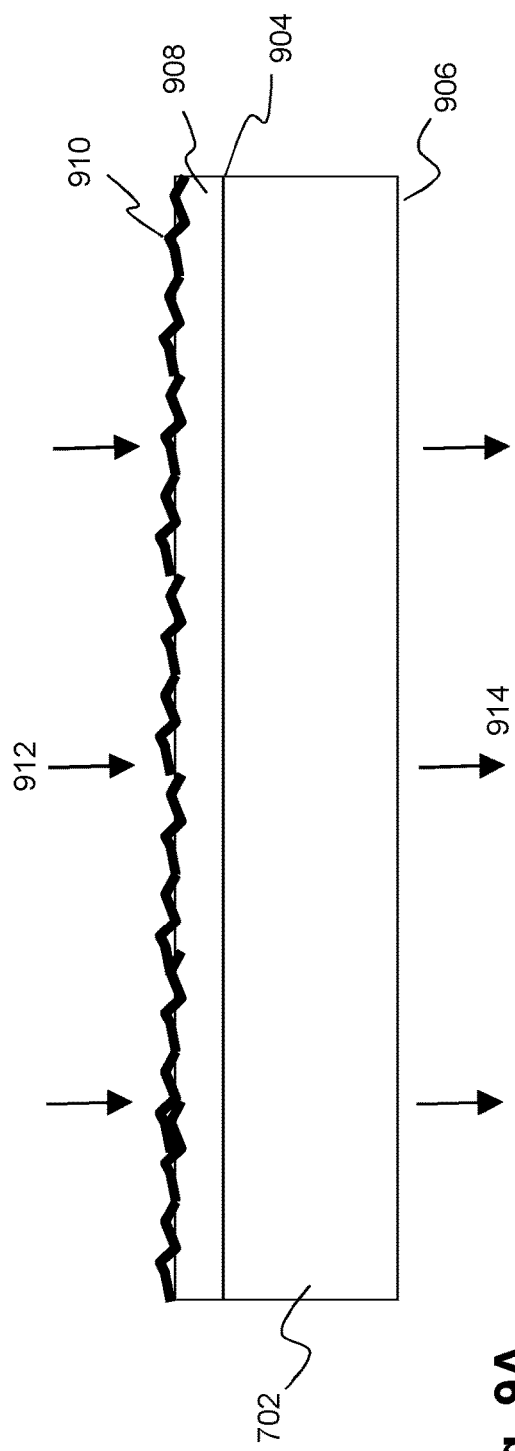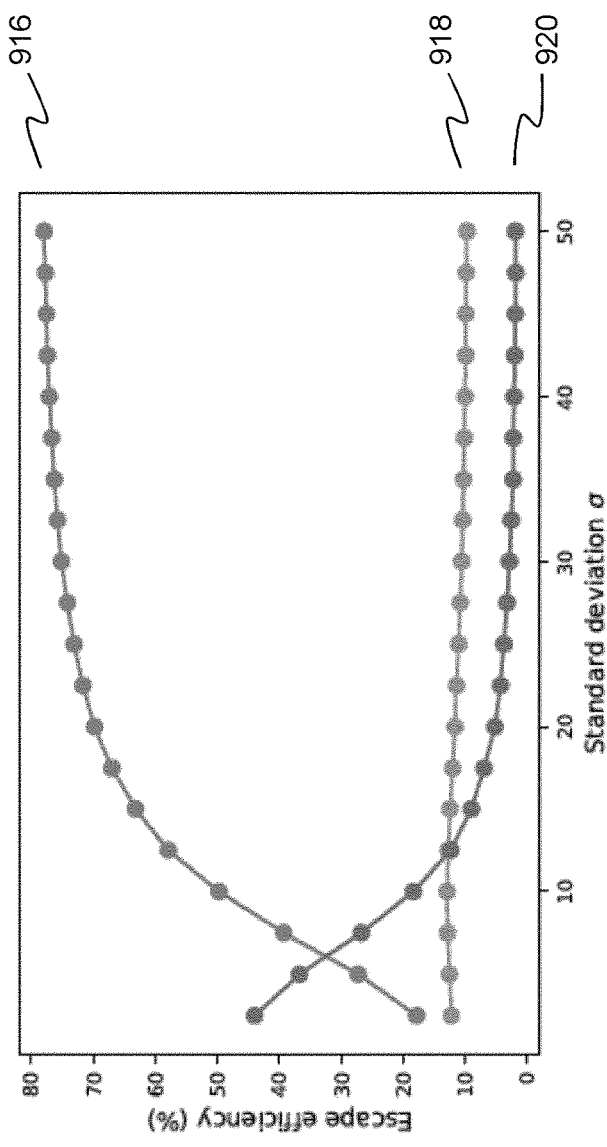
Fig. 9A
Fig. 9B

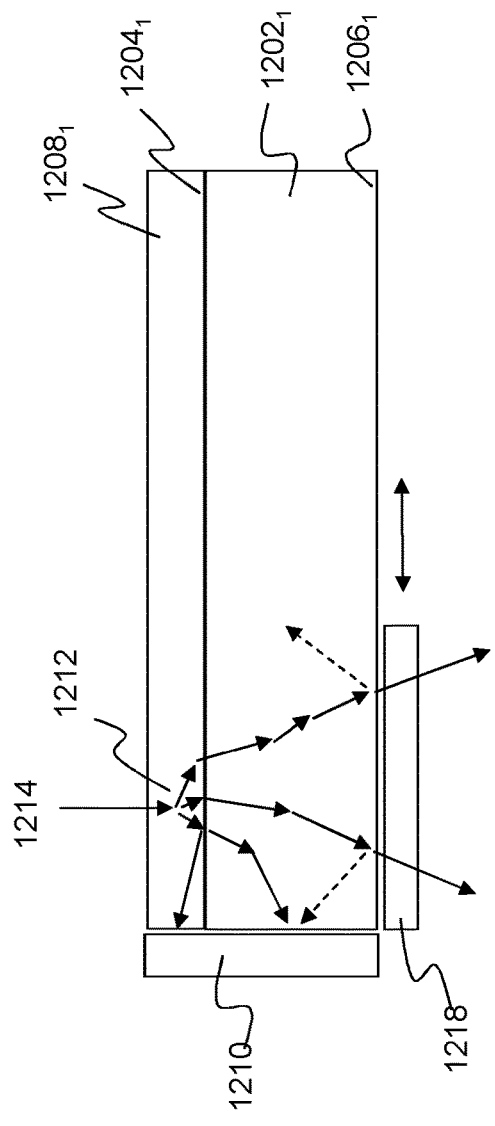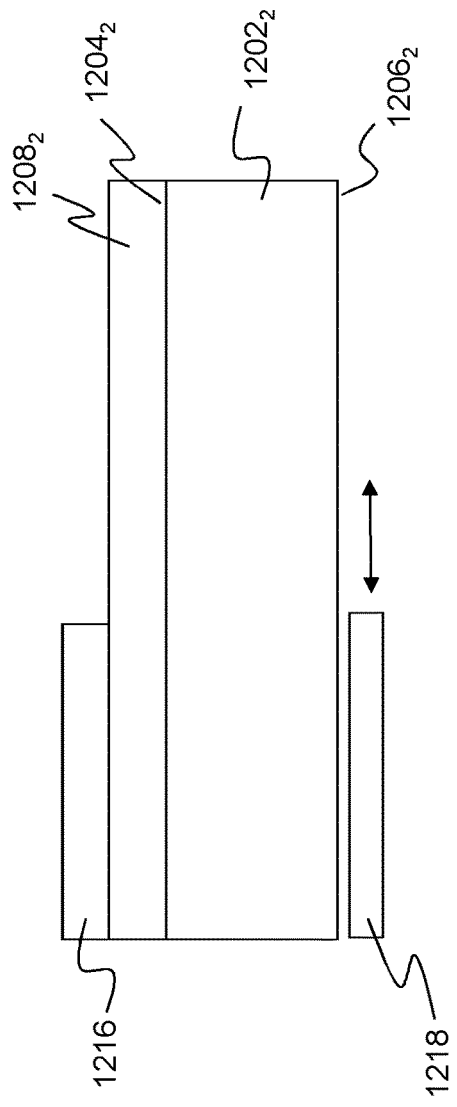
Fig. 12A
Fig. 12B

LUMINESCENT GREENHOUSE GLAZING STRUCTURES

FIELD OF THE INVENTION

The invention relates to greenhouse glazing structures, and, in particular, though not exclusively, to luminescent glazing structures comprising one or more $Eu^{2+}$ doped for greenhouses and methods for manufacturing such luminescent glazing structures.

BACKGROUND OF THE INVENTION

Greenhouses provide a controlled climate environment for efficiently growing plants and crops. To control and optimize solar light entering the greenhouse different types of coatings have been developed, which can be used to coat glazing structures or plastic transparent sheets that are part of the greenhouse. Different pigment coatings with different optical properties, such as photo-selecting, reflective coatings or diffusive coatings, are available to control light entering a greenhouse. Typically, these coatings are spray-coated and can be removed so that, depending on the season and/or the type of plants that are grown, different coatings may be used. An example of such coating is described in WO2018/169404 which describes a removable coating for greenhouses comprising a pigment such as chalk or titanium oxide. Based on such pigment dispersions, during the summer the glazing of a greenhouse may be spray-coated with an infrared radiation reflective coating if the plants are sensitive to high levels of IR radiation. Similarly, a diffusive coating may be used to remove shading effects and to provide a homogeneous exposure of plants in the greenhouse to solar light.

In the prior art it has been suggested to further improve coupling of solar light into the greenhouse based on luminescent materials. Typically, these materials include a transparent plastic sheet comprising luminescent particles. Such materials may be optimized to convert one part (or parts) of the radiation in the electromagnetic spectrum to different wavelengths for a more effective use of the radiation. For example, a luminescent spectral down conversion layer applied as a luminescent coating on glazing structures of greenhouses can enhance crop growth by reducing the spectral mismatch between the solar spectrum and the photosynthetically active radiation (PAR) region (400 nm-700 nm) of crops by converting UV light (100 nm 400 nm) which is often deleterious to crops into light that stimulates plant growth within the PAR region. For various fruiting vegetables in greenhouses an increase in light of 1% in the PAR region would yield an increase in plant production of approx. 1%. Hence, such luminescent materials may have huge economic potential. An example of a such luminescent material is described in US20170288080 which describes a luminescent coating for a greenhouse comprising a polymeric binder material with fluorescent organic pigments, for example Lumogen 305, for absorbing parts of the solar spectrum and using the energy of the absorbed photons to emit photons of wavelengths between 600 and 690 nm.

An interesting group of luminescent materials is based on inorganic rare-earth compounds. These materials can be applied in the form of a solution- or particle-based coating that includes inorganic luminescent particles dispersed in a binder material, (e.g. an organic binder material), or in the form of a thin film layer that is formed using a deposition technique such as sputtering. CN106893584 suggests the use of $Eu^{3+}$ doped (0.01-0.10%) $Al_2O_3$ as an agricultural light conversion material for converting UV radiation in the 280-400 nm band to radiation in a narrowband between 610 and 620 nm. The material has a forbidden 4f-4f transition leading to a low LQE. Other examples of such luminescent materials are described in NL1017077 and NL2002577, which describes plastic foils for greenhouses that include inorganic phosphors, in particular Y2O3-based phosphors, which are capable of converting part of UV or IR to visible light.

Merkx et al, describe in their article *"Functionalizing window coatings with luminescence centers by combinatorial sputtering of scatter-free amorphous SiAlON:Eu2+ thin film composition libraries"*, Journal of luminescence, 28 Aug. 2018 pp. 51-56 SiAlON thin films. Specific polycrystalline Eu doped SiAlON compositions such as crystalline alpha and beta EU doped SiAlON are known for applications in white light emitting diodes. The luminescent properties of these materials strongly depend on their composition and the authors examine the properties of amorphous thin films in a specific Al:Si:Eu range in a SiAlON host with the aim to use this material for electricity generation based on the principle of a luminescent solar concentrator.

Despite the above-referenced prior art, applications of these luminescent conversion materials, such as luminescent greenhouse glazing, for large scale greenhouse applications are still not available on the market. This is because known luminescent materials have absorption and emission spectra that overlap in the PAR region. Known luminescent phosphors, such as dyes, for greenhouse applications still have substantial photon losses due to overlap of the excitation and emission spectra, thereby making these materials not suitable for large-scale commercial applications. Moreover, the luminescent coatings should not only be capable of efficiently converting parts of the UV spectrum in visible light, they also should meet other properties like low toxicity, chemically stable, environmentally friendly, cheap, and suitable for large-scale production. More importantly, when depositing a luminescent material as a thin film onto the surface of a glazing of certain thickness, the resulting luminescent glazing structure should not only be able to efficiently convert UV into light of the PAR part of the spectrum but also should have good anti-reflective properties and should be able to effectively couple light of the PAR part of the spectrum out of the relatively thick glazing structure into the greenhouse.

Hence, from the above it follows that there is a need in the prior art for improved luminescent greenhouse glazing structure. In particular, there is a need for improved luminescent greenhouse glazing structure that exhibit broadband UV absorption and luminescent emission over the full PAR region (wherein the absorption and emission spectra are non-overlapping), are transparent (non-absorbing) in the PAR region, exhibit a high luminescent quantum efficiency (i.e. the ratio between emitted and absorbed photons) and provide efficient coupling of the PAR light out of the glazing structure into the greenhouse.

SUMMARY OF THE INVENTION

It is an objective of the invention to reduce or eliminate at least one of the drawbacks known in the prior art.

In an aspect, the invention may relate to a luminescent greenhouse glazing structure comprising: a glass pane for a greenhouse; and, one or more $Eu^{2+}$ doped amorphous inorganic luminescent thin film layers provided over the glass pane, wherein the one or more $Eu^{2+}$ doped amorphous inorganic luminescent layers comprise or consist essentially of the elements Al and/or Si and the elements O and/or N; and, wherein the Si concentration is selected between 0 and 45 at. %, the Al concentration between 0 and 50 at. %, the O concentration between 0 and 70 at. %, the N concentration between 0 and 60 at. % and the $Eu^{2+}$ between 0.01 and 30 at. %.

In an embodiment, the at least one of the one or more luminescent thin film layers is an $Eu^{2+}$ doped SiAlON thin film layer, wherein the Si concentration may be selected between 10 and 45 at. %, the Al concentration between 2 and 20 at. %, O concentration between 30 and 70 at. %, the N concentration between 0 and 31 at. % and the $Eu^{2+}$ between 0.05 and 8 at. %;

In an embodiment, the at least one of the one or more luminescent thin film layers is an $Eu^{2+}$ doped SiAlON thin film layer, wherein the Si concentration may be selected between 20 and 45 at. %, the Al concentration between 2 and 10 at. %, O concentration between 30 and 60 at. %, the N concentration between 0 and 31 at. % and the $Eu^{2+}$ between 0.1 and 4 at. %.

In a further embodiment the at least one of the one or more luminescent layers may be an $Eu^{2+}$ doped SiAlON thin film layer, wherein the composition of the $Eu^{2+}$ doped SiAlON thin film layer may include Si: 38.4 at %; Al: 3.7 at %; O: 41.1 at %; N: 16.3 at %; Eu: 0.5 at %, wherein the percentages of the individual elements may vary +/−10%, preferably +/−5%.

In an embodiment, the thickness of the $SiAlON:Eu^2$ thin film may be selected between 2000 and 10 nm, preferably between 1000 and 30 nm, more preferably between 800 and 40 nm.

In an embodiment, the dimensions of the glazing include a length, a width and a thickness, the length being selected between 300 and 100 cm, preferably 250 and 140 cm, more preferably 220 and 160 cm; the width being selected between 200 and 40, preferably 180 and 50, more preferably between 160 and 60 cm and thickness being selected between 6 and 3 mm, preferably 5.5 and 3.5 mm, more preferably 5.0 and 3.5 mm.

In an embodiment, the luminescent glazing structure may further comprise a thin film anti-reflection, AR, structure provided over the luminescent thin film layers, for coupling light into the glass pane.

In an embodiment, the thin-film AR structure may include at least one thin film of a porous oxide material, preferably a silicon dioxide material.

In an embodiment, the thin film anti-reflection, AR, structure may comprise a stack of dielectric thin film layers, the stack of dielectric thin film layers including one or more first layers of a first dielectric material having a first refractive index and one or more second layers of a second dielectric material having a second refractive index, the second refractive index being higher than the first refractive index, preferably at least part of the one or more first and the one or more second layers being stacked alternately on top of each other.

In an embodiment, the at least part of the one or more luminescent thin film layers may be part of a thin film anti-reflection, AR, structure for coupling light, preferably light in the UV and the PAR part of the solar spectrum into the glazing structure.

In an embodiment, wherein at least part of the one or more first layers may include a low-refractive index $Eu^{2+}$ doped SiAlON layer, preferably a $SiO_2$ layer doped with $Al^{3+}$, $N^{3+}$ and $Eu^{2+}$ or a SiAlO layer doped with $Eu^{2+}$.

In an embodiment, at least part of the one or more second layers may include a high-refractive index $Eu^{2+}$ doped SiAlON layer, preferably an AlN layer doped with $Si^{4+}$, $O^{2+}$ and $Eu^{2+}$ or a SiAlN layer doped with $Eu^{2+}$.

In an embodiment, the at least part of the one or more second layers may include a high-refractive non-doped SiAlON layer, preferably an non-doped AlN layer or an non-doped SiAlN layer In an embodiment, the glass pane may comprises a first (top) surface and a second bottom surface, the one or more $Eu^{2+}$ doped amorphous inorganic luminescent thin film layers being provided over the first (top) surface, the first (top) surface further being textured for providing a light scattering interface between the glass pane and the one or more $Eu^{2+}$ doped amorphous inorganic luminescent thin film layers, preferably the surface texture having a standard deviation of the Gaussian scattering distribution at the light scattering interface of 20 degrees or more.

In an embodiment, the one or more thin film layers including a top surface for receiving solar light, wherein the top surface may comprise a surface texture for providing a light scattering interface, preferably the surface texture having a standard deviation of the Gaussian scattering distribution at the light scattering interface of 20 degrees or more.

In an embodiment, the surface texture may include patterned cones, pyramids, microlenses with average dimensions in the nanometer range (between 10 nm and 1000 nm) or in the micrometer range (between 1 and 1000 micrometer) or wherein the texture features are (semi) random texture features with dimensions in the nanometer range or micrometer range with average dimensions in the nanometer range (between 10 nm and 1000 nm) or in the micrometer range (between 1 and 1000 micrometer).

In an aspect, the invention may relate to $Eu^{2+}$ doped inorganic luminescent materials for plant growth optimization and optical structures using such luminescent materials, the luminescent materials comprising or consisting essentially of the elements Al and/or Si and the elements O and/or N, the luminescent materials being optimized for converting solar radiation of the UV region of the spectrum between 200 nm and 400 nm into radiation of the photosynthetically active radiation (PAR) region between 400 nm and 700 nm. In an embodiment, the Si concentration in the inorganic luminescent material is selected between 0 and 45 at. %, the Al concentration between 0 and 50 at. %, the O concentration between 0 and 70 at. %, the N concentration between 0 and 60 at. % and the $Eu^{2+}$ between 0.01 and 30 at. %.

Ideally, the material for a spectral agricultural down conversion layer should meet certain requirements. The material should have advantageous luminescent properties, including broadband UV absorption, luminescent emission within the PAR region, transparent (non-absorbing) for photons in the PAR region, non-overlapping absorption and emission spectra and a high luminescent quantum efficiency (LQE), i.e. the ratio between emitted and absorbed photons. Additionally, the material should have optical, structural, and mechanical properties that are compatible with the material and/or applications of the optical structures, e.g. greenhouse glazing structures, the luminescent material is used in, including durability, hardness and color stability. In some applications, the material should be scatter-free, or at least have low scattering properties.

In another embodiment, the Si concentration in the inorganic luminescent material is selected between 10 and 45 at. %, the Al concentration between 2 and 20 at. %, the O concentration between 30 and 70 at. %, and the N concentration between 0 and 31 at. %.

The luminescent conversion materials are particular suitable for realizing amorphous $Eu^{2+}$ doped SiAlON coatings and $Eu^{2+}$ doped SiAlON nanoparticles for optical structures, such as glazing structures, for greenhouses.

For reasons of brevity, the references to $Eu^{2+}$ doped SiAlON materials (SiAlON:$Eu^{2+}$) in this disclosure include $Eu^{2+}$ doped SiAlON as well as $Eu^{2+}$ doped SiAlO, $Eu^{2+}$ doped SiAlN, $Eu^{2+}$ doped SiON, $Eu^{2+}$ doped AlON, $Eu^{2+}$ doped $SiO_2$, etc. Thus, the SiAlON materials may include any SiAlON stoichiometry which can be described as a linear combination of the neutral units $SiO_2$, $Al_2O_3$, AlN and $Si_3N_4$, i.e. $a*SiO_2+b*Al_2O_3+c*AlN+d*Si_3N_4$, wherein a, b, c and d can take on all values (including zero and non-integer numbers) independent of each other.

The optical properties of $Eu^{2+}$ doped SiAlON materials, in particular amorphous $Eu^{2+}$ doped SiAlON materials, have an ideal set of characteristics for luminescent conversion layers (LCL) that can enhance plant growth in greenhouses. The luminescent SiAlON:$Eu^{2+}$ materials are fully transparent in the PAR region, have strong absorption in the UV region and emission within the PAR region and no or at least almost no overlap with the absorption region, while the luminescent quantum efficiency (LQE) is close to unity. Additionally, the materials have superior properties in terms of durability, including e.g. chemical stability, thermal stability, hardness and color stability.

In an embodiment, the $Eu^{2+}$ luminescent materials substantially consist of the elements the elements Al and/or Si and the elements O and/or N, wherein the term substantially consist of means that the materials may only comprise traces of other elements in the amount of 0.1% or less. In a further embodiment, the $Eu^{2+}$ luminescent materials consist of the elements the elements Al and/or Si and the elements O and/or N or consists of the elements Al, Si, O, N.

In an embodiment, the luminescent SiAlON:$Eu^{2+}$ material may be an amorphous coating exhibiting a low haze (smaller than one percent) within the PAR region. This way, conversion loss due to scattered photons can be eliminated or at least substantially reduced. In an embodiment, such amorphous coating may be fabricated using a sputtering method such as reactive magnetron sputtering.

The luminescent SiAlON:$Eu^{2+}$ provides a wide tuning range of luminescence across the visible spectrum by varying the ratio between Si and Al and/or the ratio between O and N. In a further embodiment, luminescence may also be tuned based on the concentration of $Eu^{2+}$. As a result, a wide range of compositions of luminescent SiAlON:$Eu^{2+}$ materials exist, where the composition corresponds to emissions ranging from blue to red (400 nm to 700 nm), making these luminescent materials ideal to tailor the emission wavelength to the needs of the greenhouse farmer.

Si-rich compositions in this range will results in luminescent SiAlON:$Eu^{2+}$ materials absorbing photons in the UV range between 200 and 400 nm and emitting photons in the PAR region, with a high LQE.

In an embodiment, the luminescent SiAlON:$Eu^{2+}$ material may have a composition around Si: 23 at. %, Al: 9 at. %, O: 59 at. %, N: 8 at. %, Eu: 1 at. % wherein the percentages of the individual elements may vary +/−10%, preferably +/−5%. This composition provides a luminescent material with absorption of photons in the UV range between 200 and 400 nm and emission in the PAR region a high LQE.

The above-mentioned luminescent SiAlON:$Eu^{2+}$ materials may be used in optical structures, e.g. a glazing structures for a greenhouse, including glass panes coated with these materials.

In an embodiment, the glass pane may be highly transparent, diffused glass sheet having a high haze factor. In an embodiment, the diffused glass pane may have a light transmission of more than 90% and a haze factor higher than 70%. For example, the glass material may include optical scattering centers and/or textured surface(s) for scattering the light that passes the glass pane. This way, luminescent radiation generated by the $Eu^{2+}$ dopants and incoming solar radiation that passes the optical structure will be scattered in multiple directions thereby generating diffused light for optical crop growth.

Scattering of light may be achieved by patterning or texturing one or both sides of the glass pane. Hence, in an embodiment, at least one surface of the glass pane may include pattern and/or texture for scattering light in multiple directions.

In an embodiment, the SiAlON:$Eu^{2+}$ luminescent layer may be configured as a diffused coating for scattering the luminescent radiation and incoming solar radiation into multiple directions. In that case, the luminescent layer may be a polycrystalline layer.

In an embodiment, the SiAlON:$Eu^{2+}$ luminescent material may be integrated within and/or part of a diffused coating.

In an embodiment, an anti-reflection (AR) structure may be provided over SiAlON:$Eu^{2+}$ luminescent material for optimal coupling of UV and solar light into the luminescent material.

In an embodiment, the AR structure may include two or more dielectric layers, wherein the thicknesses and the refractive indices of the dielectric layers may be selected to form an AR structure for coupling UV and PAR into the luminescent layer. In an embodiment, the AR structure may be provided over a luminescent coating on a transparent substrate and may be optimized for coupling UV and PAR into the luminescent layer.

In an embodiment, the luminescent layer may be provided over a glass pane having a refractive index of approx. 1.5. In another embodiment, instead of a glass pane a transparent polymer-based pane may be used.

In an embodiment, the AR structure may be a multi-layer AR structure comprising a stack of alternating low-refractive and high-refractive index dielectric layers. In an embodiment, the low-refractive index and high-refractive index dielectric layers are of a dielectric material comprising the elements Al and/or Si and the elements O and/or N. In another embodiment, the low refractive index and high refractive index dielectric layers are of a dielectric material consisting (essentially) of the elements Al and/or Si and the elements O and/or N.

In an embodiment, a low-refractive index dielectric layer may include a $SiO_2$ layer. Such layer may have a refractive index n of approx. 1.48 (and may be referred to as low n dielectric layer). In another embodiment, a high-refractive index dielectric layer may include an AlN layer. Such layer will have a refractive index n of approx. 2.16 (and may be referred to as high n dielectric layer). In a further embodiment, a silicon aluminum oxinitride SiAlON layer may be used for a dielectric layer having a refractive index n between 1.48 and 2.16 depending on the SiAlON composition. Based on these materials, an AR coating can be designed which can couple UV and visible light, in particular PAR, into the luminescent layer.

In another embodiment, one or more luminescent SiAlON:$Eu^{2+}$ layers may be embedded into an anti-reflection structure. In an embodiment, the AR structure may be a multi-layer AR structure comprising a stack of alternating low-refractive index and high-refractive index dielectric layers, wherein the low-refractive index and high-refractive index dielectric layers are of a dielectric material comprising the elements Al and/or Si and the elements O and/or N, and wherein one or more of the low-refractive index layers and/or high-refractive index layers are doped with $Eu^{2+}$.

In an embodiment, a low refractive dielectric layer may include a $SiO_2$ layer doped with $Al^{3+}$ and $Eu^{2+}$, i.e. a luminescent $SiAlO:Eu^{2+}$ layer. Such layer will have a refractive index of approx. 1.50. In another embodiment, a low refractive index layer may include a $Eu^{2+}$ doped $SiO_2$ layer, i.e. $SiO_2:Eu^{2+}$ layer. Such layer will have a refractive index of approx. 1.48. In an embodiment, a high refractive index dielectric layer may include AlN layer doped with $Si^{4+}$ and $Eu^{2+}$, i.e. a luminescent $SiAlN:Eu^{2+}$ layer. Such dielectric layer will have a refractive index of approx. 2.14. In another embodiment, a medium refractive index layer may include a $SiAlON:Eu^{2+}$ layer having a refractive index between 1.48 and 2.16 based on the ratio between O and N. This way, an anti-reflection structure can be formed wherein the reflectivity, transmittivity, and luminescent excitation and emission region of the coating can be tuned.

In a further aspect, the invention may relate to an optical structure comprising: a transparent substrate having a first surface, a second surface and sides; and, at least one luminescent layer provided over at least one of the first surface and/or second surface of the transparent substrate, the luminescent layer comprising an $Eu^{2+}$ doped inorganic luminescent material comprising or consisting essentially of the elements Al and/or Si and the elements O and/or N, the doped inorganic luminescent material converting radiation of the UV region between 200 nm and 400 nm of the solar spectrum into the photosynthetically active radiation (PAR) region (400 nm-700 nm) of the solar spectrum, wherein the Si concentration in the inorganic luminescent material is selected between 0 and 45 at. %, the Al concentration between 0 and 50 at. %, the O concentration between 0 and 70 at. %, the N concentration between 0 and 60 at. % and the $Eu^{2+}$ between 0.01 and 30 at. %.

In an embodiment, the at least one luminescent layer is an $Eu^{2+}$ doped SiAlON layer, wherein the Si concentration is selected between 10 and 45 at. %, the Al concentration between 2 and 20 at. %, O concentration is selected between 30 and 70 at. % and the N concentration between 0 and 31 at. %.

In an embodiment, the at least one transparent substrate may be an inorganic transparent substrate such as glass substrate or wherein the transparent substrate is a polymer-based transparent substrate.

In an embodiment, the at least one transparent substrate has a high haze factor, preferably the transparent substrate being a diffused transparent substrate having a high haze factor, the high haze factor being larger than 70%, preferably larger than 80%, more preferably larger than 90%; and/or, wherein the luminescent layer has a low haze factor, the low haze factor being smaller than 20%, preferably smaller than 10%, more preferably smaller than 2%.

In an embodiment, the at least one luminescent layer is an amorphous or nanocrystalline layer.

In an embodiment, the transparent substrate may have a low haze factor, the low haze factor being smaller than 20%, preferably smaller than 10%, more preferably smaller than 2%; and/or, the at least one luminescent layer may have a high haze factor, the high haze factor being larger than 70%, preferably larger than 80% or more preferably larger than 90%.

In an embodiment, the luminescent layer comprises polycrystalline or microcrystalline $SiAlON:Eu^{2+}$ layer.

In an embodiment, the $Eu^{2+}$ concentration may be selected in at least one of the ranges between 0.1 and 25 at. %; or, between 0.2 and 20 at. %.

In an embodiment, the optical structure may further comprise an anti-reflection, AR, coating, preferably a multi-layer AR coating, for coupling light into the optical structure, preferably the AR coating being provided over the luminescent layer or the luminescent layer being part of the AR coating or embedded in the AR coating.

In an embodiment, the AR coating may comprise a stack of dielectric layers, the stack of dielectric layers including one or more first layers of a first dielectric material having a first refractive index and one or more second layers of a second dielectric material having a second refractive index, the second refractive index being higher than the first refractive index, preferably at least part of the one or more first and the one or more second layers being stacked alternately on top of each other.

In an embodiment, at least part of the one or more first layers may include a low-refractive index $Eu^{2+}$ doped SiAlON layer, preferably a $SiO_2$ layer doped with $Al^{3+}$, $N^{3+}$ and $Eu^{2+}$ or a SiAlO layer doped with $Eu^{2+}$; and/or, wherein at least part of the one or more second layers may include a high-refractive index $Eu^{2+}$ doped SiAlON layer, preferably an AlN layer doped with $Si^{4+}$, $O^{2+}$ and $Eu^{2+}$ or a SiAlN layer doped with $Eu^{2+}$.

In an embodiment, the optical structure may be optically coupled to at least one photovoltaic cell, preferably optically coupled to one of the sides of the optical structure.

In an embodiment, at least a transparent near-infrared photovoltaic cell may be provided over at least part of the at least one luminescent layer, preferably the optical structure further comprising an expandable reflective screen for reflecting light leaving the optical structure via the second surface back into the optical structure.

In a further aspect, the invention may relate to a window assembly for a greenhouse comprising an optical structure according to any of the embodiments in this application.

Hence, the luminescent $SiAlON:Eu^{2+}$ material may form or be part of an anti-reflection structure or coating in various ways. For example, a luminescent $SiAlON:Eu^{2+}$ material composition including a relative large amount of Si (32>at. %) and $O_2$ (64>at. %) (corresponding to luminescent materials with a high LQE) can have a refractive index lower than 1.51 (glass) which makes it suitable as an anti-reflective coating.

Alternatively, the luminescent $SiAlON:Eu^{2+}$ material may be incorporated in a multi-layer dielectric AR stack with alternating high and low refractive index $SiAlON:Eu^{2+}$ compositions.

The invention will be further illustrated with reference to the attached drawings, which schematically will show embodiments according to the invention. It will be understood that the invention is not in any way restricted to these specific embodiments.

BRIEF DESCRIPTION OF THE DRAWINGS

FIGS. 9A and 9B depict a luminescent greenhouse glazing comprising a surface scattering interface according to an embodiment of the invention;

FIGS. 12A and 12B depict luminescent greenhouse glazing according to various embodiments of the invention;

DETAILED DESCRIPTION

In this disclosure, divalent Europium ($Eu^{2+}$) doped SiAlON luminescent thin films are described that have superior and improved properties for greenhouse and crop growth applications. The improved properties include improved luminescent, optical and/or material properties when compared to conventional luminescent materials that are used in crop growth applications.

It has been surprisingly found that certain SiAlON:$Eu^{2+}$ compositions exhibit UV absorbing PAR emitting $Eu^{2+}$ doped SiAlON material wherein the absorption and emission spectra exhibit no or almost no overlap. In particular, it has been found that luminescent $Eu^{2+}$ doped SiAlON materials absorb a substantial part of the UV band of the solar spectrum and convert radiation in this band to radiation of a longer wavelength, in particular radiation in the photosynthetically active radiation (PAR) region. The SiAlON host material exhibits superior properties in terms of mechanical strength, chemical inertness and thermal resistance and is for that reason used in protection and anti-reflection coatings in the glass industry. The $Eu^{2+}$ doped SiAlON material forms a very stable conversion material that is fully compatible with standard production processes of the glass industry. In some embodiments, the $Eu^{2+}$ doped SiAlON material may be used to form scatter-free amorphous $Eu^{2+}$ doped SiAlON thin film layers. The use of a low-scattering amorphous SiAlON thin-film layer in a solar conversion device will ensure that the luminescent light does not escape the conversion device by scattering.

The materials, their advantages and their uses in luminescent coatings for greenhouses and luminescent sheet structures for greenhouses are described hereunder in more detail with reference to the figures.

Figure 1A:
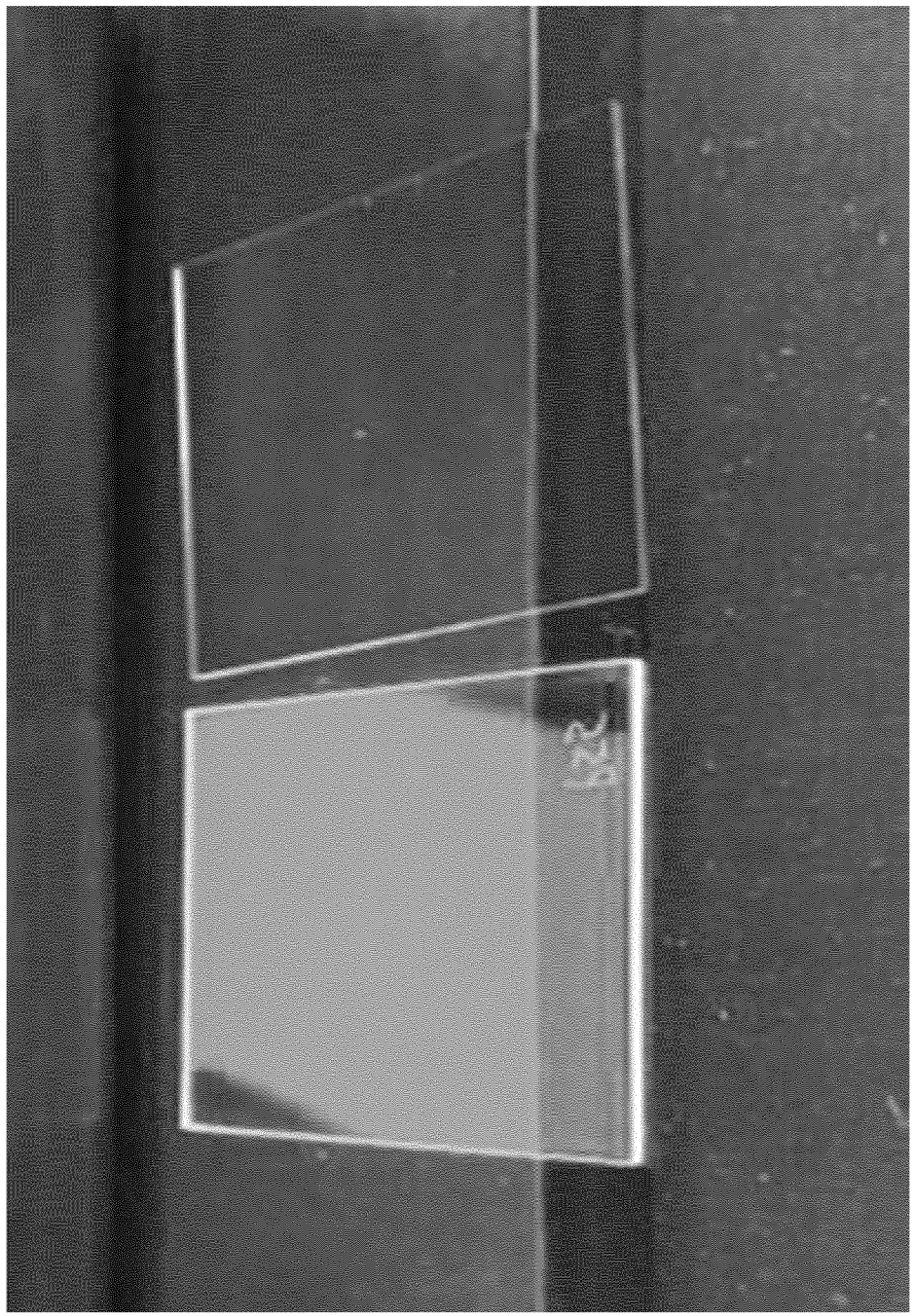
FIG. 1A-1C depicts a photograph, an XRD- and EDX measurements of a luminescent thin film according to an embodiment of the invention.

FIG. 1A depicts a photograph of a transparent substrate coated with an amorphous SiAlON:$Eu^{2+}$ thin film (left) and uncoated substrate (right). The photographs were taken under illumination by broad-band UV light causing the amorphous SiAlON:$Eu^{2+}$ coating to emit radiation in the PAR region, i.e. between 400 and 700 nm. The thin film was deposed on a glass substrate using a sputtering process as described above resulting in an amorphous SiAlON:$Eu^{2+}$ thin film layer of approx. 800 nm thickness.

Figure 1B:
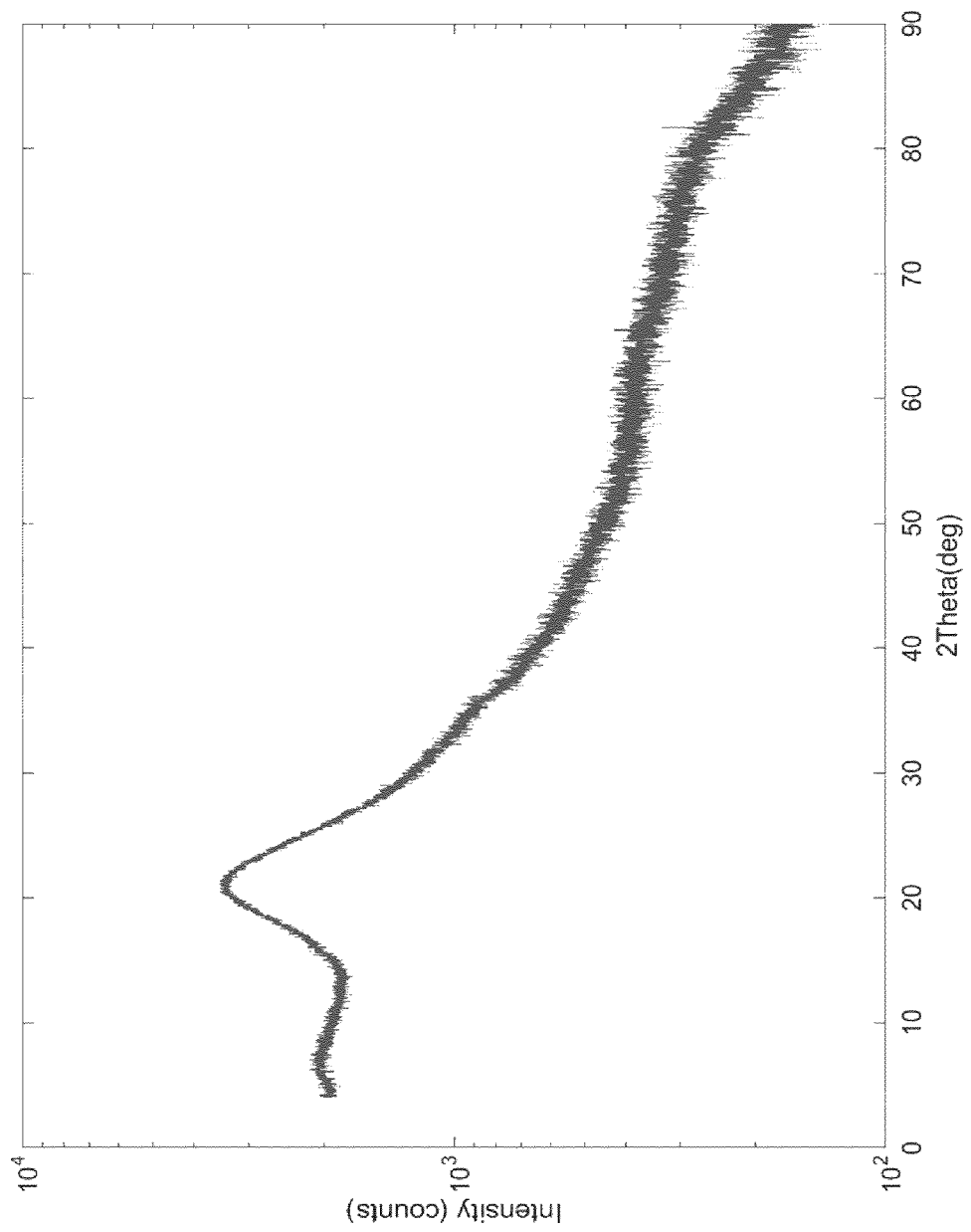
Figure 1C:
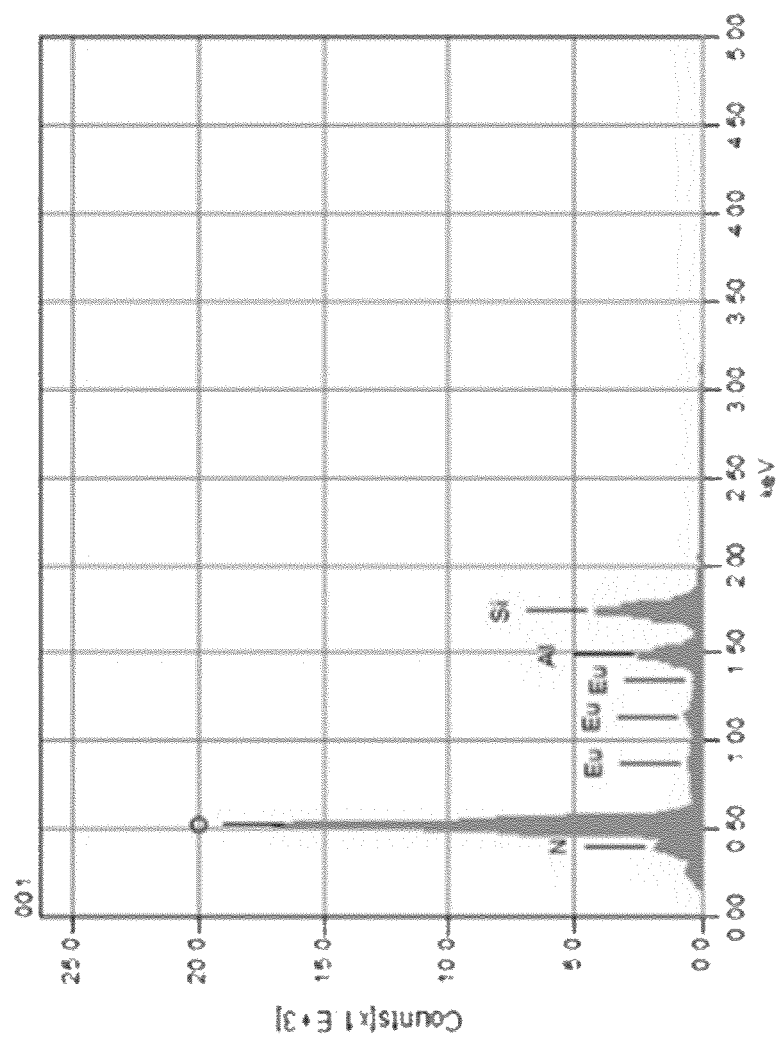

The Eu2+ doped SiAlON thin film was deposited on glass substrate within a magnetron sputtering system with a base pressure of $1\times10^{-9}$ bar, at room temperature. Prior to the deposition, the substrate was cleaned for 15 min in an ultrasonic cleaner with soap solution and subsequently rinsed with acetone, ethanol and DI water. The deposition was carried out with 5.08 cm diameter metal Al (99.9995%), Si (99.999%) and Eu (99.99%) targets that were reactively co-sputtered with 30 W DC power, 130 W RF power and 40 W RF power respectively for 11.25 h. The deposition rate of Eu was reduced by with a stainless steel mask, with a pattern of concentric holes 5.45 mm in diameter, blocking 50% of the surface of the Eu target. The process gas flow consisted of 18 sccm 6N purity Ar, 0.75 sccm 5N purity $O_2$ and 13.25 sccm 3N purity $N_2$ into the sputtering chamber at a working pressure of $4\times10^{-2}$ mbar. $O_2$ and $N_2$ were introduced next to the substrate, while Ar was introduced at the Si source. Following the sputter deposition, the thin film was annealed at 600° C. for 30 minutes in a rapid thermal processing (RTP) system to activate the luminescence. The annealing temperatures were reached with a ramp rate of 5° C. $s^{-1}$ and the RTP system was flushed with 9 SLM $N_2$ containing 7% $H_2$ during the entire annealing procedure. FIG. 1B depicts an XRD measurement of the thin film of FIG. 1A showing its amorphous nature. FIG. 1C depicts an EDX measurements of the same thin film providing information on the composition of the material. The measurements show a composition of Si around 23 at. %, Al around 9 at. %, Eu around 1 at. %, N around 8 at. % and O around 59 at. %.

Figure 2:
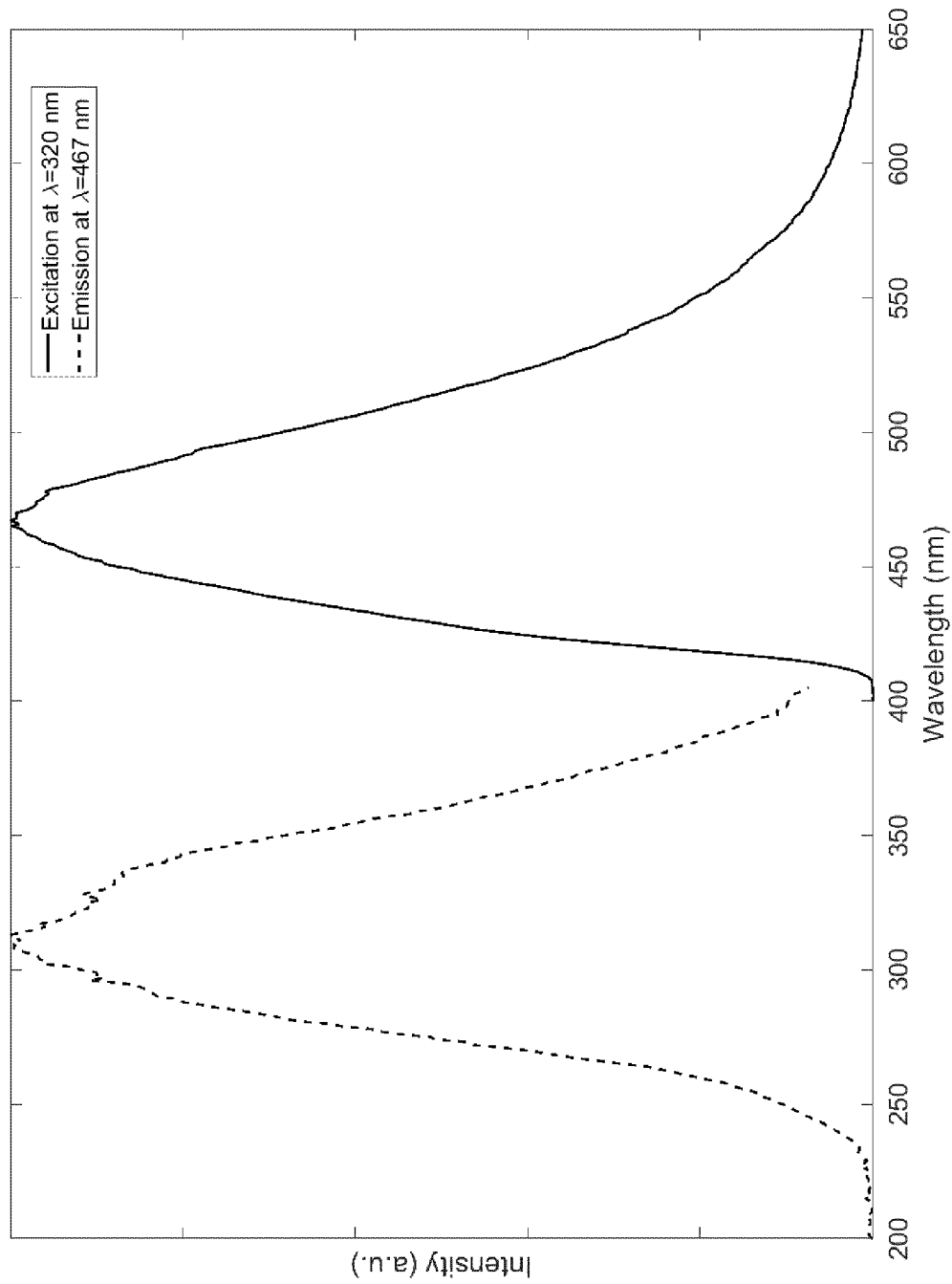
FIG. 2 depicts an excitation and emission spectrum of a luminescent thin film according to an embodiment of the invention.

The excitation and emission spectra of the luminescent layer of FIG. 1A are depicted in FIG. 2. In particular, FIG. 2 depicts the excitation spectrum 202 and emission spectrum 204 of the amorphous SiAlON:$Eu^{2+}$ thin film layer of FIG. 1A. The SiAlON:$Eu^{2+}$ thin film was fabricated using a sputtering technique as described above. As shown in FIG. 2, the spectra exhibit no or almost no overlap and show excellent UV absorption between 250 and 400 nm and PAR emission between 400 nm and 600 nm. The emission observed is a broad band attributable to 5d→4f transitions in $Eu^{2+}$. The wavelength where the emission is most intense is located at 467 nm for this specific SiAlON:$Eu^{2+}$ composition.

Different deposition techniques may be used to form an $Eu^{2+}$ doped SiAlON thin film according to the embodiments described in this application. The deposition processes are designed such that an amorphous SiAlON:$Eu^{2+}$ is formed on a substrate which may be used to form amorphous scatter-free or at least a low-scattering luminescent greenhouse glazing structures.

In an embodiment, a sputtering method, preferably a reactive magnetron sputtering technique, based on the elements Al, Si, O and N (SiAlON) may be used. The thin film may be deposited on various glazing of different materials, including but not limited to float glass, quartz glass, borosilicate glass, low-iron glass, etc. The glazing may be kept at room temperature or at elevated temperatures up to 650° C. for glass and up to 1300° C. for quartz. In a preferred embodiment, a low-temperature deposition technique may be selected to deposit or grow the luminescent thin film.

An exemplary synthesis method for producing an amorphous $Eu^{2+}$ doped SiAlON thin film may include the following steps:

prior to the deposition, the substrate may be cleaned by rinsing with ethanol and/or DI water.

the deposition may be carried out with separate Al, Si, and Eu targets and/or combined Al—Si—Eu target (for example 71% Si, 28% Al, 1% Eu);

during sputtering, the process gas flow may comprise of a mixture of Ar, $O_2$, $N_2$ and $H_2$ (for example 18 sccm Ar, 0.75 sccm $O_2$, 13.25 sccm $N_2$ and 0.4 sccm $H_2$);

following the sputter deposition, the sample may be annealed at temperatures between of 50 and 1400° C. to enhance the luminescence, preferably an annealing step and an annealing temperature is selected that is compatible with the fabrication processes of the glass industry;

during annealing, system may be flushed with forming gas containing $H_2$ during the entire annealing procedure.

Figure 3:
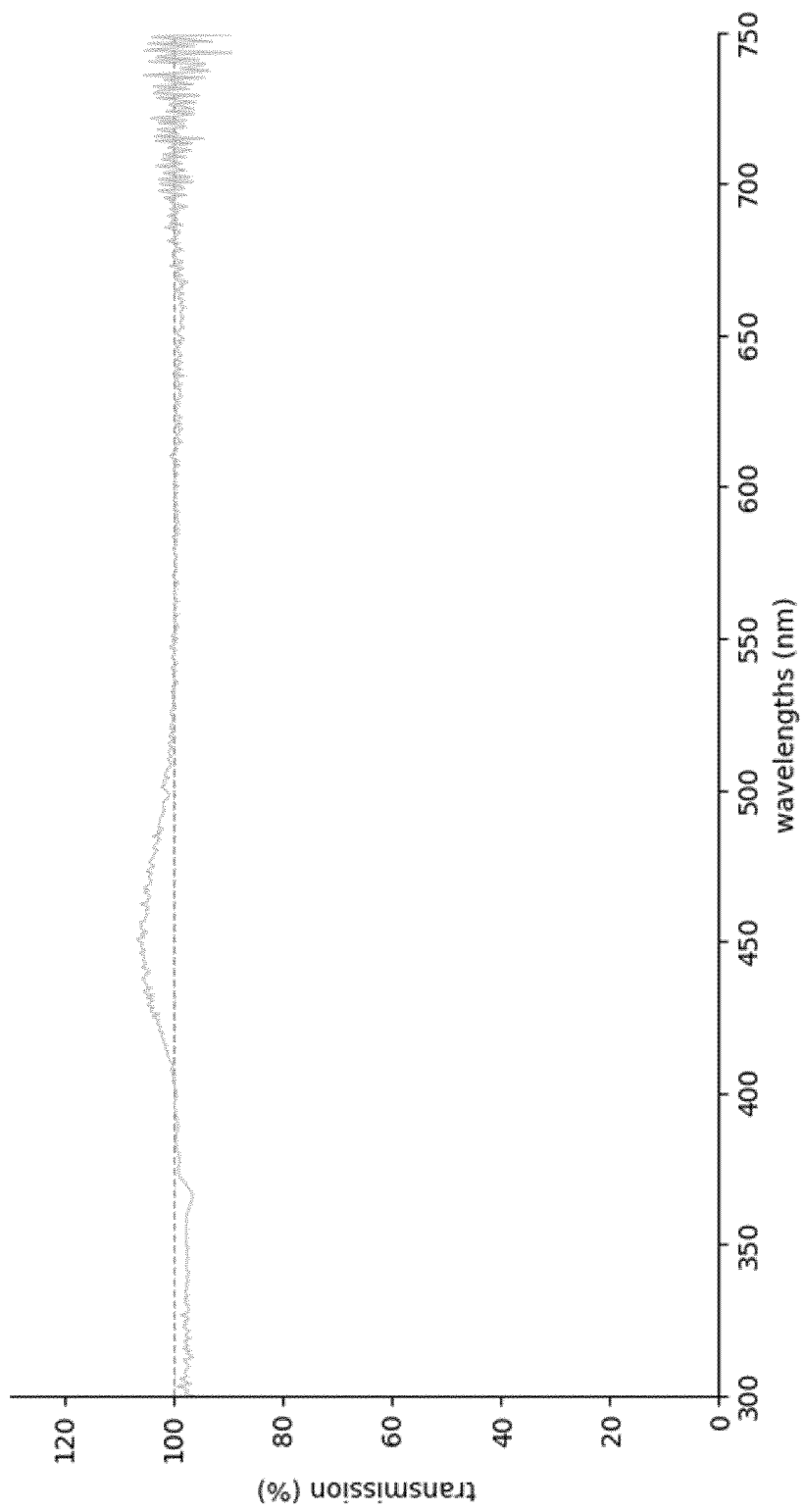
FIG. 3 depicts the transmission of a luminescent thin film according to an embodiment of the invention.
Figure 4:
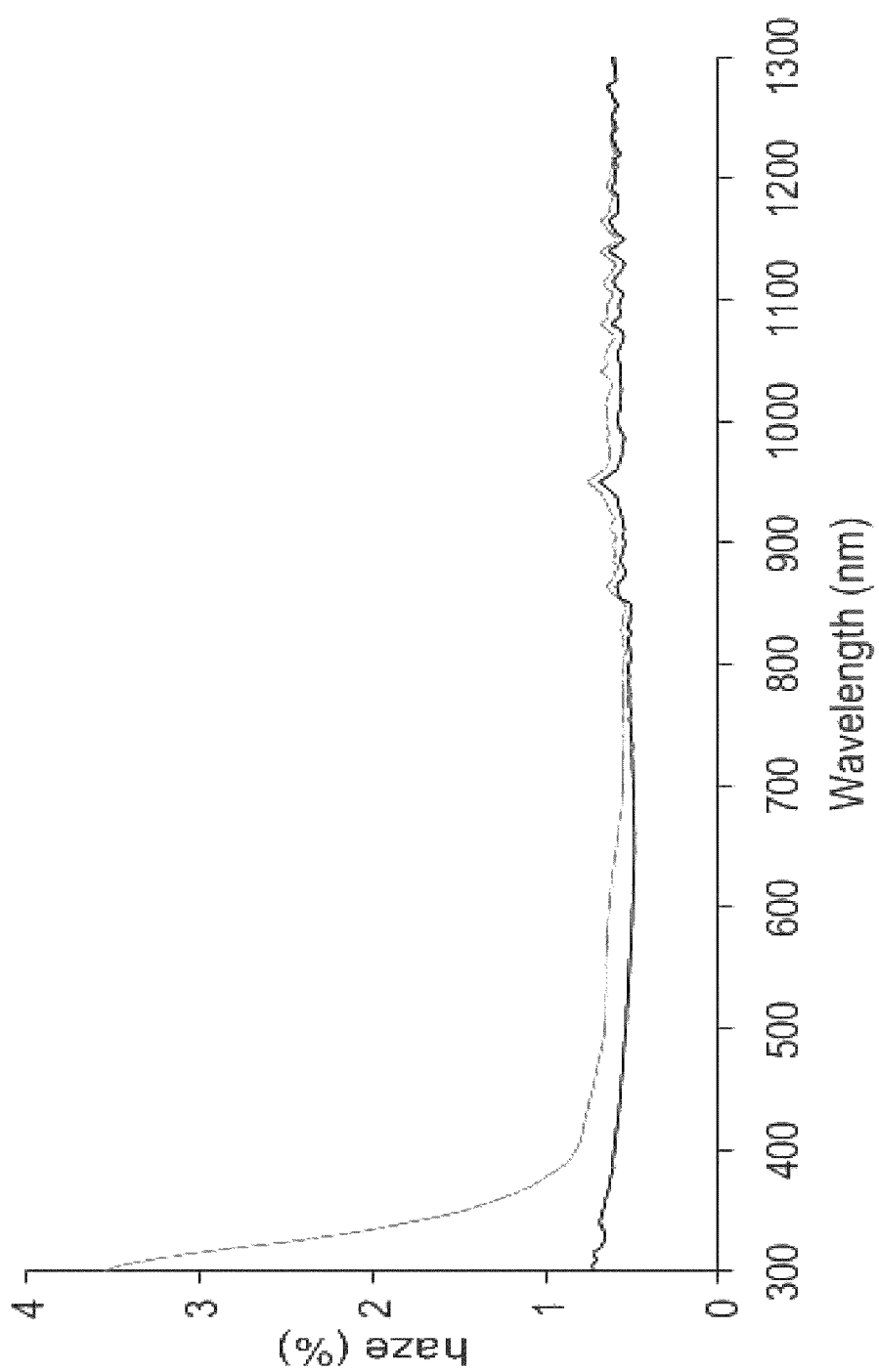
FIG. 4 depicts the haze of a luminescent thin film according to an embodiment of the invention.

A glazing coated with an amorphous SiAlON:$Eu^{2+}$ thin film layer that is produced by the sputtering process described above exhibits excellent optical properties such as transparency in the PAR region and haze. As shown in FIG. 3 the transmission of the coated SiAlON:$Eu^{2+}$ glazing shows >100% transmission in (part of) the PAR region and absorption in the UV region when illuminated by broad band UV light compared to an uncoated glazing. Additionally, the luminescent glazing has excellent optical properties such as the haze as shown in FIG. 4. The haze (in %) represents the ratio between the diffused transmission and the total transmission of a plain quartz substrate (black line) and of an amorphous SiAlON:$Eu^{2+}$ film that was formed on a quartz substrate (grey line). Due to the amorphous nature of the coating, the haze in the visible range (400 nm to 700 nm) does not exceed 1%.

In an embodiment, a wet coating technique may be used to deposit an SiAlON:$Eu^{2+}$ thin film on a glazing structure. In particular, a sol-gel wet-coating may be used. A solution may be prepared containing precursors for elemental Si, Al, O, N, and Eu, which can be directly applied onto a glazing by conventional wet coating techniques. Different post-deposition treatments, including an annealing treatment, can be applied to a sol-gel coated glazing. Traces of binder material precursors can also be included in the liquid precursor for different purposes such as controlling solution viscosity, increasing coating adhesion, minimizing coating porosity, altering coating surface morphology, etc.

An exemplary sol-gel coating technique for forming a SiAlON:Eu2+ thin film coated glazing may include the following steps:

stoichiometrically weighting 7.7447 g $Si(OC_2H_5)_4$, 0.3299 g $Al(NO_3)_3$, 0.0681 g $Eu_2O_3$;

dissolving the $Eu_2O_3$ in minimal amount of diluted nitric acid;

dissolving $Al(NO_3)_3$ in ethanol and placing it on a heating plate;

dissolving TEOS ($Si(OC_2H_5)_4$) in ethanol and placing it on a heating plate;

mixing TEOS solution with $Al(NO_3)_3$ solution and $Eu_2O_3$ solution to form a mixture of sol;

diluting the sol to the wt. concentration to 10% of oxide;

spraying or spin coating the diluted solution on the glass substrate and aging for 72 hours days under 60° C.;

calcinating at 500° C. to fully remove organic residual;

using a flash annealing or rapid thermal processing facility to anneal the coating at 1000° C. under reducing atmosphere.

Based on these deposition techniques, different SiAlON:$Eu^2$ thin films may be produced, wherein, per 1 molar SiAlON:$Eu^{2+}$ product, the $Eu^{2+}$ dopant concentration may be selected between 0.01 and 49.99 mol % of cations (Si and Al) and the Si/Al ratio may be selected between 99:1 and 1:99. In another embodiment, the $Eu^{2+}$ dopant concentration may be between selected between 0.5% and 10 mol % of cations (Si and Al) and the Si/Al ratio may be selected between 20:1 and 1:20.

Figure 5:
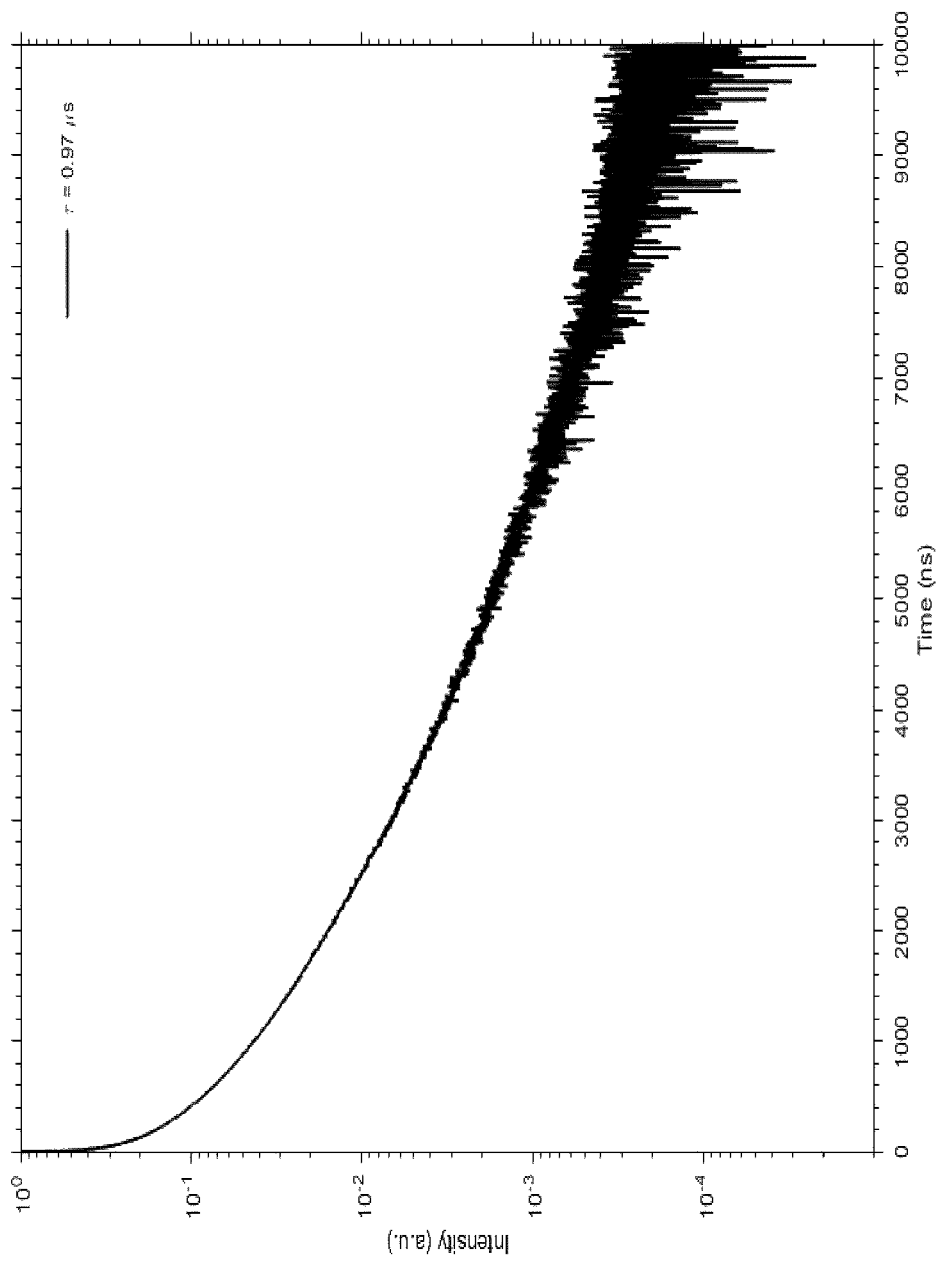
FIG. 5 depicts decay spectra of a luminescent thin film according to an embodiment of the invention.

FIG. 5 depicts decay spectra of a luminescent coating according to an embodiment of the invention. In particular, the figure depicts decay spectra of the SiAlON:$Eu^{2+}$ coating with a decay time of approx. one microsecond indicating a high luminescence quantum efficiency.

Figure 6:
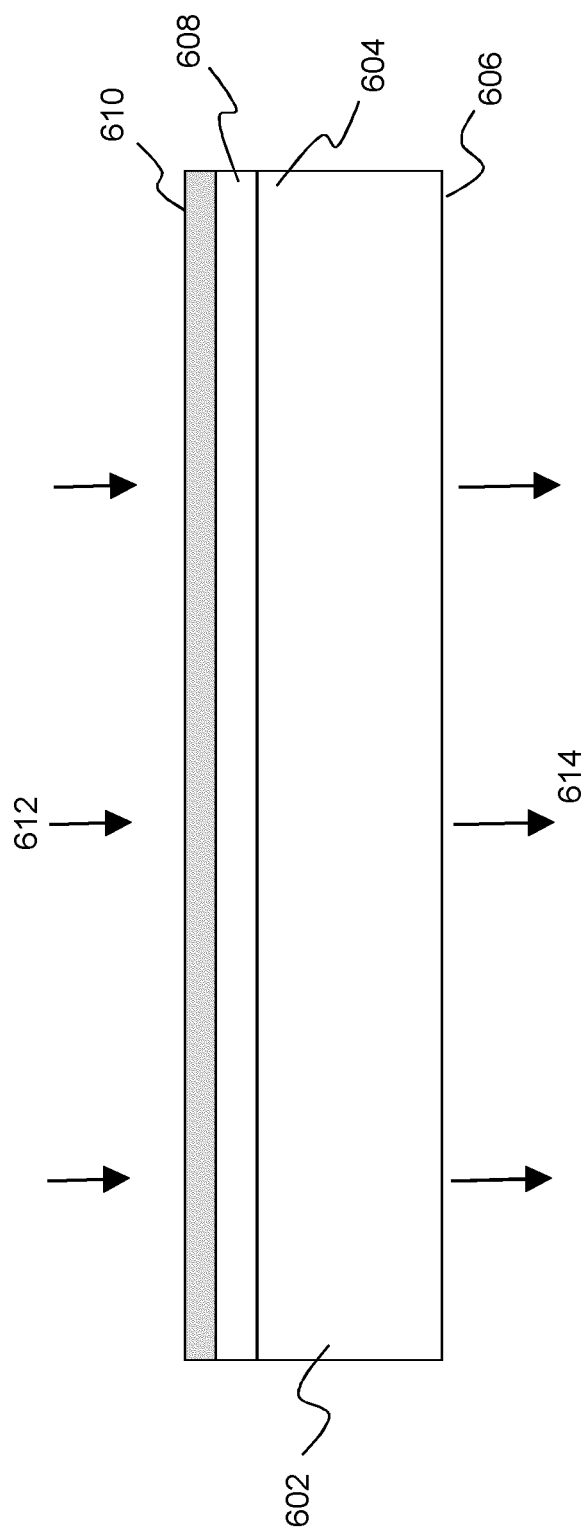
FIG. 6 depicts a luminescent greenhouse glazing according to an embodiment of the invention.

FIG. 6 depicts a luminescent greenhouse glazing structure according to an embodiment of the invention. As shown in the figure, the glazing structure may include a glazing 602 having a first surface 604 and second surface 606, wherein the first surface may be configured to receive external solar light 612 and the second surface may be configured to couple light 614 out of the glazing structure into the greenhouse. The glazing structure may be part of or used in a greenhouse or a housing for indoor crop growing.

The length of the glazing may be selected between 300 and 100 cm, preferably 250 and 140 cm, more preferably 220 and 160 cm and the width of the glazing may be selected between 200 and 40, preferably 180 and 50, more preferably between 160 and 60 cm. Typical dimensions (length×width) may include: 2.140×1.122, 1.650×1.22, 1.650×997 and 1.650×730 mm. Further, a glazing may have a thickness between 6 and 3 mm, preferably 5.5 and 3.5 mm, more preferably 5.0 and 3.5 mm.

A SiAlON:$Eu^2$ thin film 608 may be deposited based on a sputtering method or a sol-gel method on the first surface of the substrate. The thickness of the SiAlON:$Eu^2$ thin film may be between 2000 and 10 nm, preferably between 1000 and 50 nm, more preferably between 800 and 80 nm. Here, the composition of the SiAlON:$Eu^2$ may be selected so that efficient UV absorption is achieved without requiring relatively thick thin film layers. This requirement is important as the thickness and the refractive index of the luminescent layer will contribute to the optical properties of the luminescent glazing structure.

A broadband anti-reflection (AR) thin film structure 610 may be provided over the luminescent thin film for reducing the percentage of reflected light and enable to achieve higher transmission through the glass. The AR thin film structure may include one or more thin film layers of low refractive index materials. In an embodiment, the AR thin film structure may comprise at least one porous SiO2 thin film layer. Porous SiO2 thin films are known to have good anti-reflective properties and are used as AR coatings in solar cells. Additional advantage of porous SiO2 is that the presence of scattering centres in the porous coating may increase the inherent volume scattering, thereby improving outcoupling of light out of the glazing. Porous SiO2 coating may be based on reactive high-power impulse magnetron sputtering at high working pressure as described in the article by Kim et al, *Anti-reflection porous SiO2 thin film deposited using reactive high power impulse magnetron sputtering at high working pressure for use in a-Si:H solar cells*, in Solar Energy Materials & Solar Cells, 130 (2014) pp 582-586. Alternatively, these layers may be deposited using plasma-enhanced chemical vapour deposition technique (PECVD) as described by Barranco et al *Room temperature synthesis of porous SiO2 thin films by plasma enhanced chemical vapor deposition*, Journal of Vacuum Science & Technology A 22, 1275-1284 (2004) or co-sputtering of the coating with a soluble material (such as a halide, such as NaCl) followed by immersion in water to remove the soluble material, to obtain a porous sponge-like structure as described by Dedoncker et al, *Sputter deposition of porous thin films form metal/NaCl powder targets*, App. Phys. Lett, 115, 041601 (2019). The contents of these articles may be incorporated by reference into this application.

In addition and/or alternatively to a porous ARC thin film such as illustrated in FIG. 6, other types of AR thin film structures may also be used. For example, an AR thin film structure including multiple thin film layers (a thin film stack) wherein, in some embodiments, one or more of the multiple thin film layers may be a SiAlON:Eu$^2$ thin film layer.

Figure 7A:
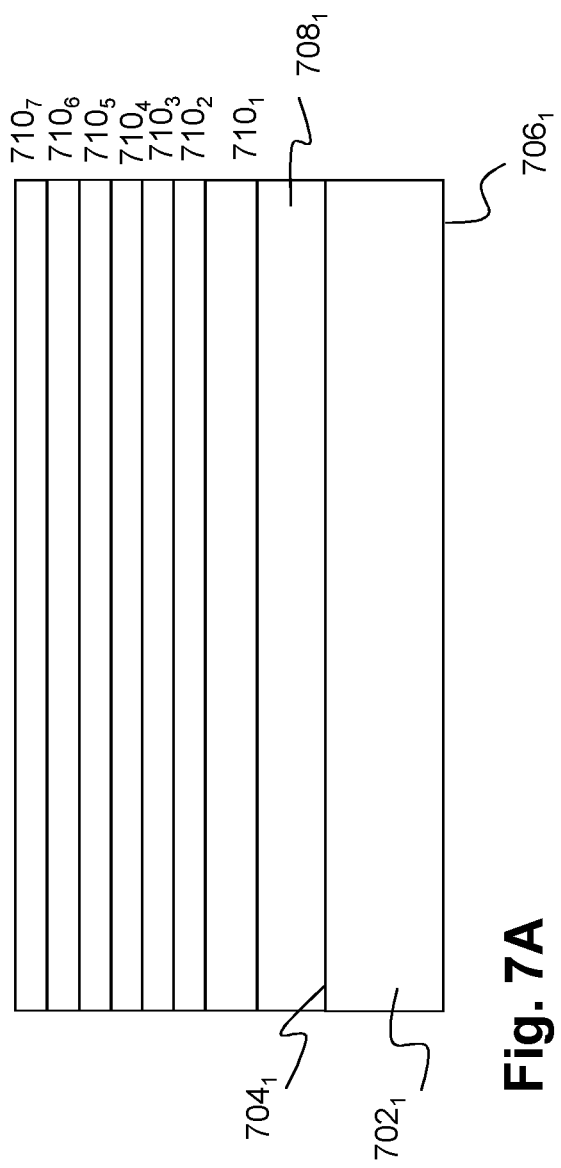
FIG. 7A-7C depict embodiments of a luminescent greenhouse glazing comprising an antireflection structure according to various embodiments of the invention.
Figure 7B:
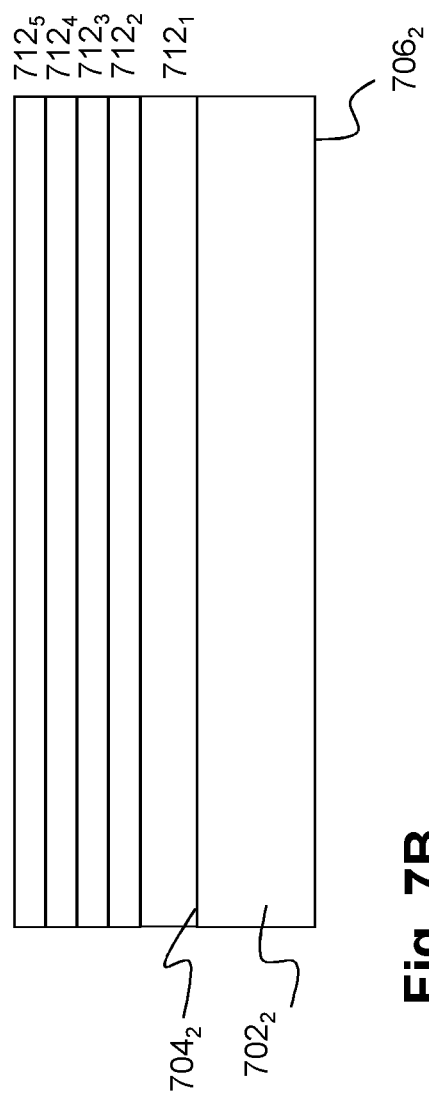

FIGS. 7A and 7B depict embodiments of a luminescent greenhouse glazing comprising a multi-layer antireflection structure according to various embodiments of the invention. For example, FIG. 7A depicts an embodiment of a luminescent greenhouse glazing wherein a multi-layer dielectric thin film stack is provided over one or more luminescent thin film layers which comprise a SiAlON:Eu$^{2+}$ based luminescent material. The one or more luminescent thin film layers may for example include Eu doped SiAlON thin film layer and an Eu doped SiAlO thin film layer. The multi-layer dielectric thin film stack is configured as an anti-reflection (AR) coating for UV and PAR light. In particular, the figure depicts a schematic of an optical structure comprising a glazing $702_1$ having a first surface $706_1$ and a second surface $704_1$, wherein at least one luminescent layer $708_1$ is provided over the first surface and a dielectric multilayer AR coating $710_{1-7}$ for UV and PAR is provided over the luminescent layer.

In an embodiment, the anti-reflection structure may include two or more dielectric layers, wherein the thicknesses and the refractive indices of the dielectric layers are selected to form an AR structure for the glazing of a glass composition which typically has a refractive index of approx. 1.5. In an embodiment, such AR thin film structure may be provided over the one or more luminescent layers that are provided on a greenhouse glazing, i.e. a glass pane that is suitable for use in greenhouses. The stack of dielectric thin film layers may include alternating high and low refractive index layers. Preferably the high- and low refractive index layers are composed a SiAlON composition or a Eu2+ doped SiAlON composition.

In an embodiment, a low refractive index dielectric layer may include for example a SiO$_2$ layer or a dielectric layer of a material having a similar (or lower) refractive index as (than) SiO$_2$. Such layer may have a refractive index of approx. 1.5 or lower (referred to as low n dielectric material). In another embodiment, a high refractive index dielectric layer may include for example an AlN layer or a dielectric layer of a material having a similar (or higher) refractive index as (than) AlN. Such layer will have a refractive index of approx. 2 or higher (referred to as high n dielectric material). In a further embodiment, an oxinitride SiAlON layer may be used for a dielectric layer having a refractive index between 1.48 (SiO$_2$) and 2.16 (AlN) depending on the SiAlON composition. Based on these materials, an AR coating can be designed which can couple UV and visible light, in particular PAR, into the luminescent layer.

In an embodiment, the multilayer AR coating may include a stack of dielectric layers, in this case seven dielectric layers of the following thickness and composition: 150.36 nm (low n layer $710_1$)/13.01 nm (high n layer $710_2$)/27.99 nm (low n layer $710_3$)/43.90 nm (high n layer $710_4$)/11.56 nm (low n layer $710_5$)/32.64 nm (high n layer $710_6$)/81.43 nm (low n layer $710_7$) wherein the low n dielectric material may be SiO$_2$ and the high n dielectric material may be AlN.

Figure 8:
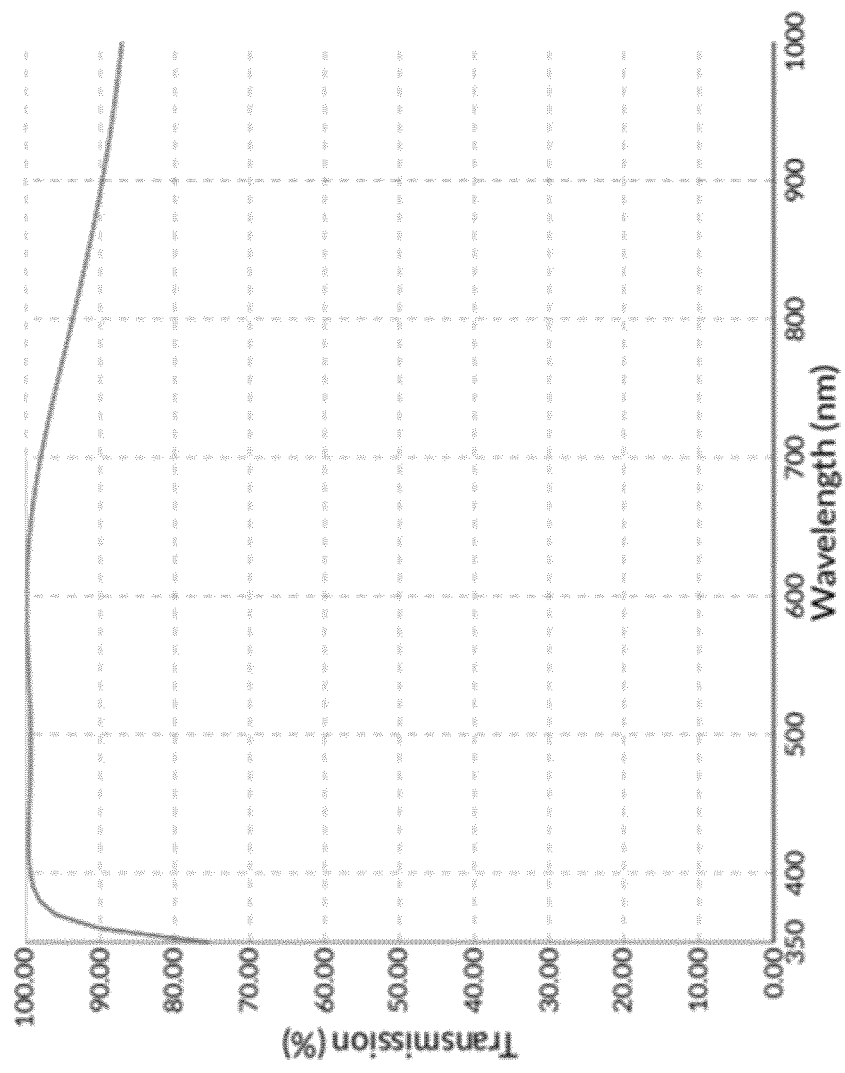
FIG. 8 depicts a modelled transmission of a thin film antireflection structure for a luminescent greenhouse glazing according to an embodiment of the invention.

It is noted that the layers in FIGS. 7A and 7B are only schematics and do not correctly represent the thicknesses of the layers. The modelled transmission of light through such multilayer AR coating is provided in FIG. 8.

FIG. 7B depicts an embodiment of a luminescent greenhouse glazing wherein a luminescent multi-layer dielectric thin film stack is provided over the first surface of a glazing structure. In particular, the figure depicts a schematic of a luminescent greenhouse glazing comprising a glass glazing $702_2$ having a first surface $706_2$ and a second surface $704_2$, and a dielectric multilayer AR thin film structure $712_{1-5}$ for UV and PAR which comprises one or more luminescent layers.

In this embodiment, the dielectric thin film stack may comprise one or more luminescent layers. Hence, in this embodiment, the luminescent material may be integrated in or embattled in an AR structure which is configured to couple UV and PAR light into the coating. In an embodiment, a low refractive index (low n) dielectric layer may include a SiO$_2$ layer doped with a few at. % Al$^{3+}$, N$^{3+}$ and Eu$^{2+}$ ions. Such layer will have a refractive index of approx. 1.50. In an embodiment, a high refractive index (high n) dielectric layer may include AlN layer doped with a few at. % Si$^{4+}$, O$^{2+}$ and Eu$^{2+}$ ions. Such dielectric layer will have a refractive index of approx. 2.14. In an embodiment, the luminescent multilayer AR coating may include a stack of dielectric layers, in this case five dielectric layers of the following thickness and composition: 139.47 nm (low n layer $712_1$)/12.30 nm (high n layer $712_2$)/26.07 nm (low n layer $712_3$)/100.86 nm (high n layer $712_4$)/76.05 nm (low n layer $712_5$).

Figure 7C:
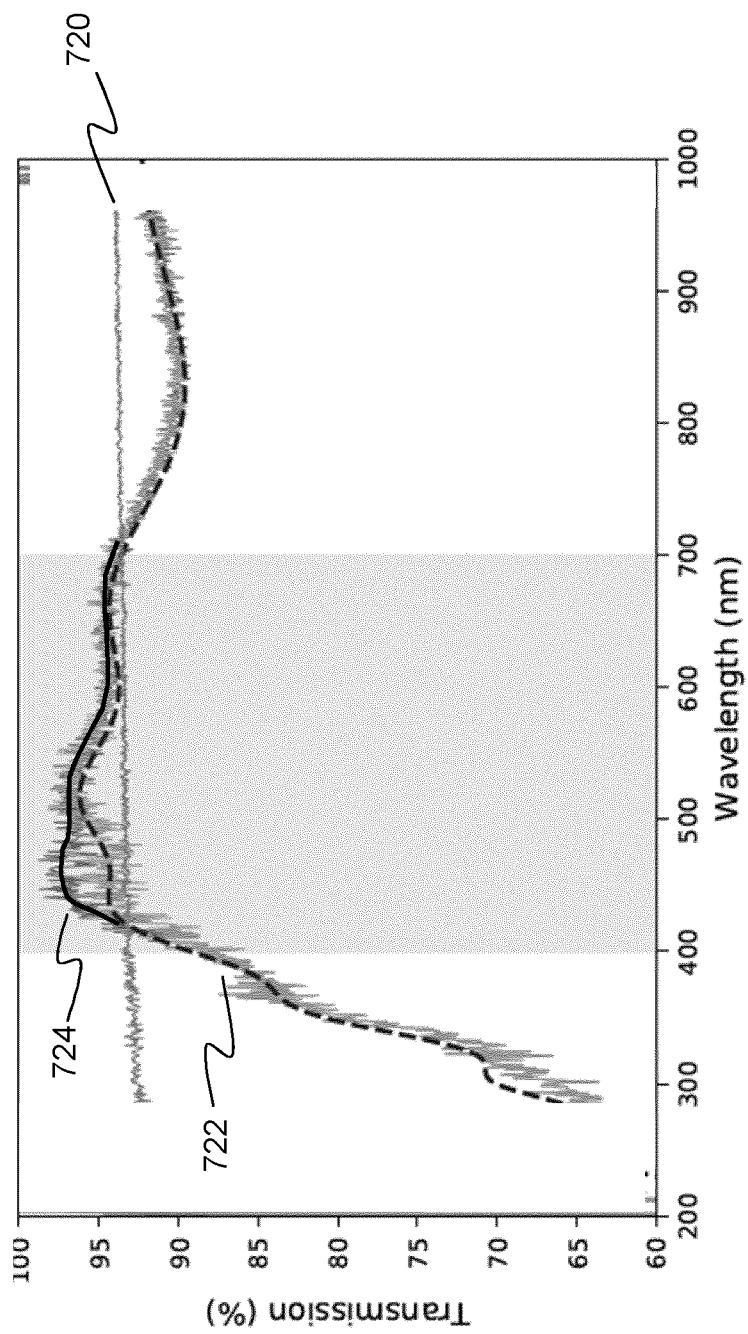

A sputtering process may be used to realize a luminescent thin-film AR stack. For example, a thin-film stack with five layers may be realized based on the following process steps:
  prior to the deposition, the substrate may be cleaned by rinsing with ethanol and/or DI water.
  the deposition may be carried out with separate Al, Si, and Eu targets and/or combined Al—Si—Eu target (for example 91.5% Si, 7.5% Al, 1% Eu);
  during sputtering, the process gas flow may comprise of a mixture of Ar, O2, N2 and H2 (for example 18 sccm Ar, 0.75 sccm O2, 13.25 sccm N2 and 0.4 sccm H2);
  An AR stack may comprise of 5 layers where
    The top layer is a SiAlO:Eu layer of 91 nm thickness sputtered with 18 sccm Ar and 1.2 sccm 02 for 1201 seconds
    The second layer is a SiAlN layer of 68 nm thickness sputtered with 18 sccm Ar and 14 sccm N2 for 3931 seconds
    The third layer is a SiAlO:Eu layer of 26 nm thickness sputtered with 18 sccm Ar and 1.2 sccm O2 for 343 seconds
    The forth layer is a SiAlN layer of 26 nm thickness sputtered with 18 sccm Ar and 14 sccm N2 for 1503 seconds
    The fifth layer can be as thick as necessary for sufficient luminescence conversion but for example 800 nm thickness sputtered with 18 sccm Ar and 1.2 sccm 02 for 10558 seconds
  During the sputter deposition, the substrate may be heated to enhance the luminescence to temperatures between of 50 and 650° C.
  following the sputter deposition, the sample may be annealed at temperatures between of 50 and 1400° C. to enhance the luminescence, preferably an annealing step and an annealing temperature is selected that is compatible with the fabrication processes of the glass industry;

during annealing, system may be flushed with forming gas containing H2 during the entire annealing procedure FIG. 7C depicts a transmission graph of a luminescent thin-film AR structure. Table 1 provides an overview of the parameters of the three thin film layers forming the luminescent thin-film AR structure:

TABLE 1 parameters of a three-layer luminescent thin film AR structure.

| Layer number | 1 | 2 | 3 |
|---|---|---|---|
| material | SiAlON:Eu2+ | SiAlN | SiAlON:Eu2+ |
| Refractive index type | Low-n | High-n | Low-n |
| Thickness (nm) | 528 | 27 | 108 |

The thin films are fabricated as a thin film stack on a quartz substrate. FIG. 7C depicts the measured transmission of the luminescent thin-film AR structure in two different situation. These measurements are compared with the transmission of the uncoated quartz substrate as represented by line 720. The dotted black line 722 represents the simulated transmission of the luminescent thin-film AR structure wherein a 400 nm filter blocks the UV part of the solar spectrum. Hence, in that case conversion of the UV light does not take place and the thin-film AR structure will function as a conventional AR coating. The effect of the AR coating on the transmission in the PAR region between 400 and 70 nm is clearly visible, showing an increase in the transmission due to the anti-reflective properties of the thin-film AR coating. The simulated transmission nicely follows the measured data (depicted by the grey 'noisy' signal). The solid line 724 provides a guide for the experimental data of the unfiltered case. These data clearly show an increase in the transmission in the PAR region, in particular in the 400 to 500 nm region due to the UV to PAR conversion. These graphs provide a clear indication that a glazing structure with a luminescent thin-film AR structure provides an improvement in the transmission of the glazing structure in the PAR region.

The luminescent glazing structures described with reference FIG. 7A-7C are non-limiting and many further embodiments are possible without departing the scope of the invention. For example, the sequence of the layers may be changed without departing the scope of the invention. Thus, in an embodiment, the one or more luminescent layers may be provided on top of the AR thin-film stack (instead of being positioned underneath the AR thin-film stack). In further embodiments, only one or more of the high refractive layers or low refractive index layers may be doped with $Eu^{2+}$.

FIGS. 9A and 9B depict a luminescent greenhouse glazing structure according to another embodiment of the invention. As shown in the figure, the glazing structure may include a glazing 902 having a first surface 904 and second surface 906, wherein the first surface may be configured to receive external solar light 912 and the second surface may be configured to couple light 914 out of the glazing structure into the greenhouse. The glazing structure may be part of or used in a greenhouse or a housing for indoor crop growing. A thin film structure 908 comprising one or more SiAlON:$Eu^2$ thin film layers may be deposited based on a sputtering method or a sol-gel method on the first surface of the glazing. The thin film structure may include luminescent thin film structures as described with reference to FIG. 6-8 above. The dimensions and thicknesses of the glazing may be similar to those of the luminescent greenhouse glazing structure described with reference to FIG. 6.

In this embodiment, the top surface of the thin film structure, e.g. a SiAlON:$Eu^2$ thin film, may be subjected to a surface treatment to introduce a light scattering top surface 910. The surface scattering interface may be introduced to maximize light coupling out of the second (bottom) surface of the glazing. The surface treatment may include an etching step resulting in a textured surface.

The etching process may be a wet etching process or a dry etching process. The wet etching process works by dissolving parts of the surface by immersing it in a chemical solution. In an embodiment, a mask may be used to selectively etch the material. A dry etching process may be based on sputtering or dissolution of the material at. This may be achieved by a reactive ion etching step or ion beams. The resulting surface characteristics (and therefore scattering properties) can be tuned by adjusting various etching parameters (e.g. plasma feed gas, reactive gas types and flows, gas pressure, etch time etc.) and measuring the scattering properties of the textured surface. The textured surface may have a regular (period) pattern or it may have a random pattern.

The texture patterns may have features (diameters and heights) in the nanometer to micrometer range. Texture features fabricated on the basis of a mask-based etching process may include cones, pyramids, microlenses in nanometer range (approx. 10 nm up to 1000 nm) or features in the micrometer range, e.g. 1 micrometer up to 500 micrometer. Alternatively, texture features fabricated on the basis of a mask-les etching process, may result in substantially random texture features with dimensions in the nanometer range or micrometer range.

A measure for the surface roughness of the surface interface is the standard deviation of the Gaussian scattering distribution of light scattered at the surface interface. Such measurements are well known in the art, e.g. Kurita et al, *Optical surface roughness measurement from scattered light approximated by two-dimensional Gaussian function*, Transactions on Engineering Sciences vol. 2, 1993. This article may hereby incorporated by reference in this disclosure.

The effect of surface scattering on light coupling out of the glazing structure of FIG. 9A is shown in FIG. 9B. In this example, the glazing structure includes a 50×50×1.1 mm Borofloat substrate with a 1 μm thick luminescent SiAlON:$Eu^2$ thin film layer. This figure represents the escape efficiency of light escaping the glazing structure as a function of the surface roughness of the top interface. Here, curve 916 represents the escape efficiency of light escaping via the second (bottom) surface, curve 918 represents the escape efficiently of light escaping via the first (top) surface and curve 920 the escape efficiency of light escaping via the sides.

This figure shows that increasing the scattering properties, i.e. the standard deviation of the Gaussian scattering distribution of the top interface significantly improves bottom outcoupling of light. As shown in this figure, the bottom escape efficiency 916 drastically increases (more than 70% up to 78%) with increasing scattering properties of the top surface. In an embodiment, the top surface may be etched to introduce a surface texture with a standard deviation of the Gaussian scattering distribution of more than 20 degrees, leading to an escape efficiency of around 70%. In this particular embodiment, the second surface 906 of the glazing and the interface between the first surface 904 of the glazing and the luminescent thin film are smooth, non-scattering interfaces.

A luminescent film may be deposited on the surface of a glazing of diffusive glass by sputtering under low power and low temperature. This way lateral diffusion of dopants into the glazing can be substantially reduced so that low scattering interface is achieved. A highly scattering top surface may involve etching of the luminescent coating itself. The etching treatment may also decrease the refractive index of the top interface therefore also providing an anti-reflective function.

Figure 10A:
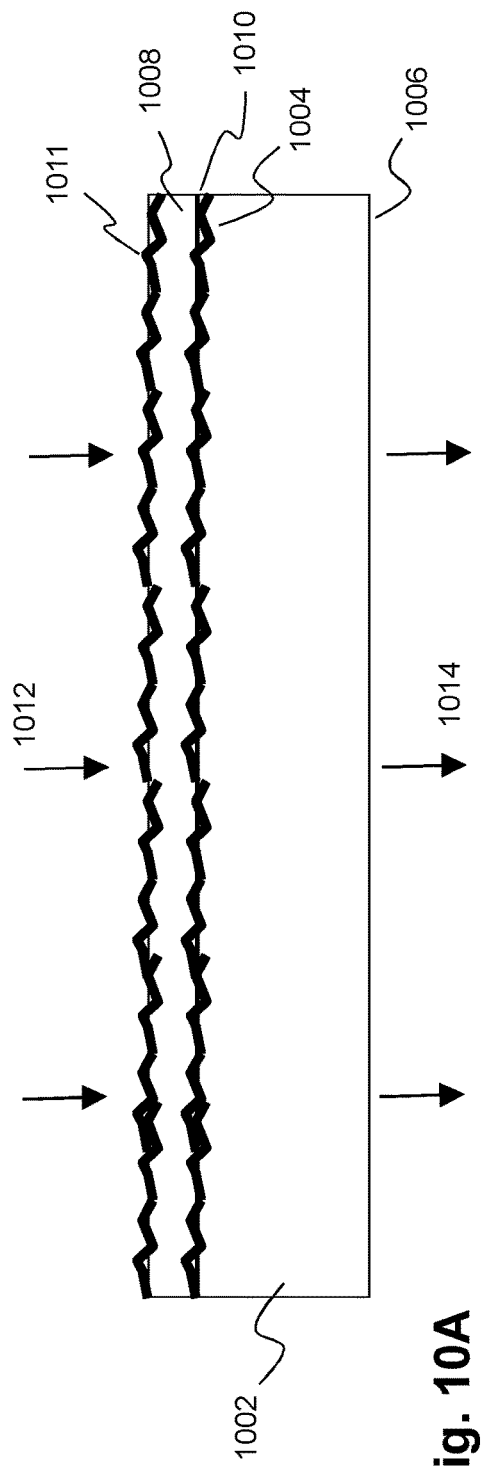
FIGS. 10A and 10B depict a luminescent greenhouse glazing comprising a surface scattering interface according to another embodiment of the invention.
Figure 10B:
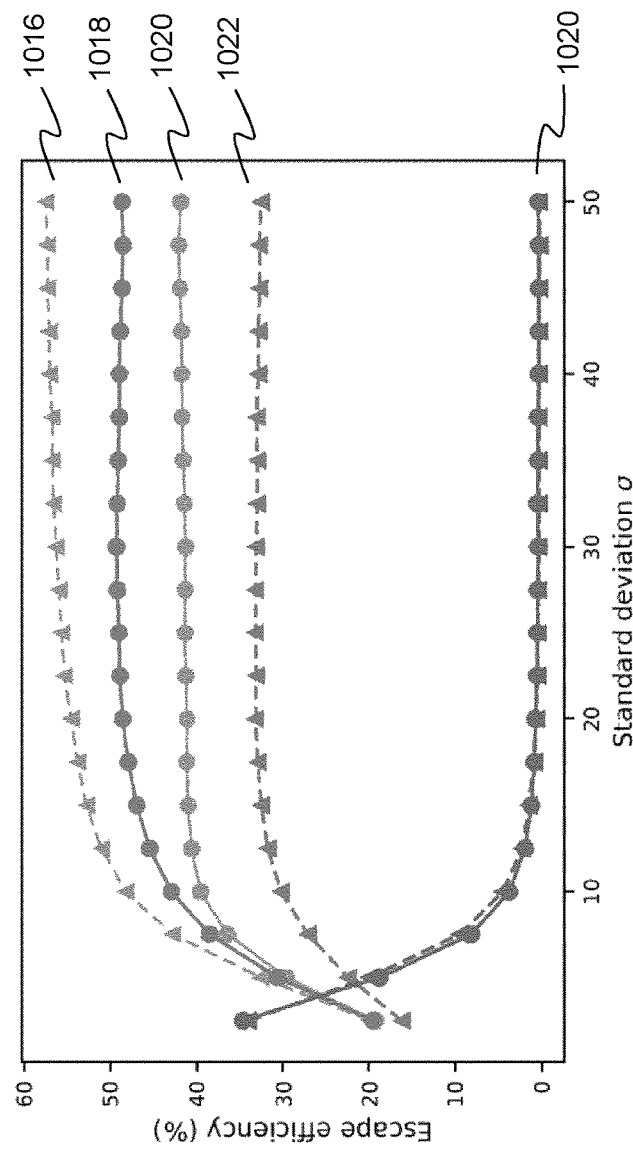

FIGS. 10A and 10B depict a luminescent greenhouse glazing structure according to yet another embodiment of the invention. The glazing structure may include a glazing 1002 having a first surface 1004 and second surface 1006, wherein the first surface may be configured to receive external solar light 1012 and the second surface may be configured to couple light 1014 out of the glazing structure into the greenhouse. The glazing structure may be part of or used in a greenhouse or a housing for indoor crop growing. A thin film structure 1008 comprising one or more SiAlON:$Eu^2$ thin film layers may be deposited based on a sputtering method or a sol-gel method on the first surface of the glazing. The thin film structure may include luminescent thin film structures as described with reference to FIG. 6-8 above. The dimensions and thicknesses of the glazing may be similar to those of the luminescent greenhouse glazing structure described with reference to FIG. 6.

In this embodiment, before depositing the one or more SiAlON:$Eu^2$ thin film layers onto the surface of the glazing, the surface of the glazing, a glass pane, may be subjected to a surface treatment to introduce a textured surface for light scattering in a similar way as described with reference to FIGS. 9A and 9B. After deposition of the one or more SiAlON:$Eu^2$ thin film layers onto the structured surface, a scattering interface 1010 is formed between the substrate and the one or more thin-film layers. Also this scattering interface may be used to maximize light coupling out of the second (bottom) surface of the glazing. Depending on the thickness of the one or more SiAlON:$Eu^2$ thin film layers and the deposition parameters, the structure of the scattering interface may be reproduced in the top surface layer. This is schematically illustrated in the figure by the textured top surface 1011. In another variant the top surface of the one or more SiAlON:$Eu^2$ thin film layers may be smooth.

The effects of the scattering interface of both variants are shown in FIG. 10B. Here a similar glazing structure is used as described with reference to FIG. 9A. The figure shows how increasing surface scattering of the scattering interface (i.e., between the glass substrate and the luminescent coating) is beneficial to increase light bottom outcoupling. Here, the graphs 1018 (bottom outcoupling) and 1020 (top outcoupling) identified by the dots relate to the case where the texture of the scattering interface is reproduced in the top interface (as shown in FIG. 10A), whereas the graphs identified by the triangles 1016 (top outcoupling) and 1016 (bottom outcoupling) relate to the case where the texture of the scattering interface is not reproduced in the top interface. These graphs show that in case both the top surface and the interface is textured the bottom outcoupling efficiency increases as function of the standard deviation of the Gaussian scattering distribution.

Figure 11A:
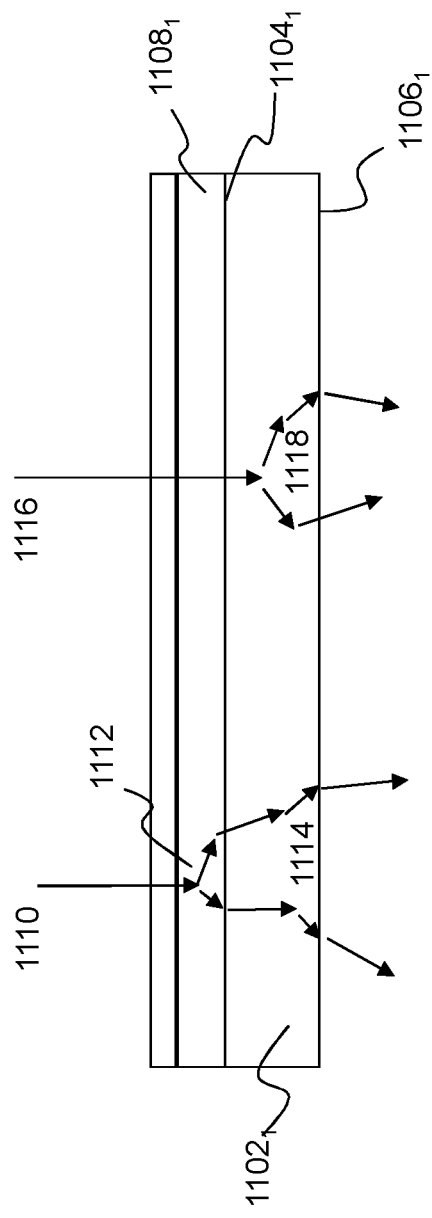
FIGS. 11A and 11B depict a luminescent particle-based anti-reflection coating according to an embodiment of the invention.
Figure 11B:
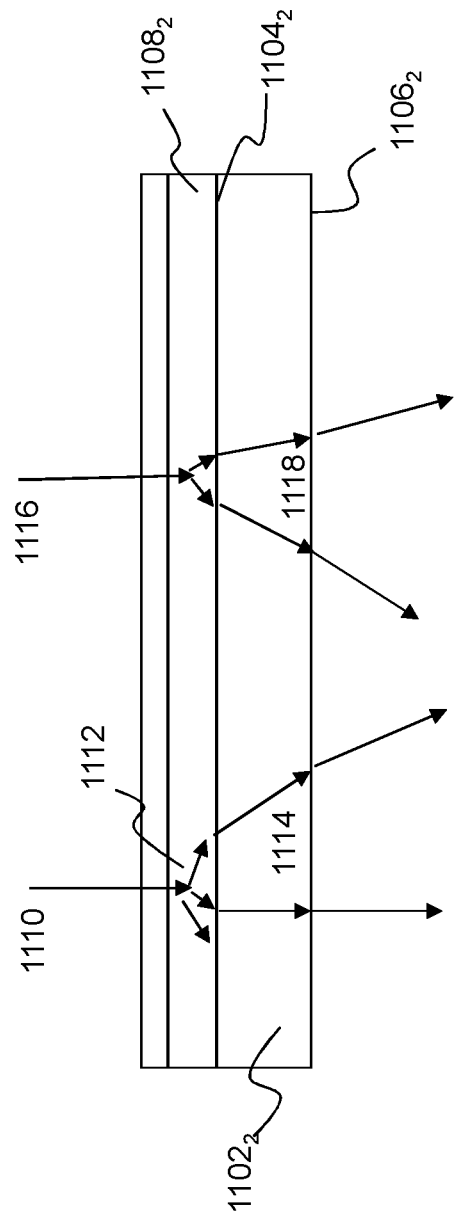

FIGS. 11A and 11B depict exemplary luminescent glazing structures according to various embodiments of the invention. As shown in these figures a luminescent glazing structure may include a glazing, e.g. a glass pane $1102_{1,2}$ having a first surface $1004_{1,2}$ and second surface $1106_{1,2}$, wherein the first surface may be configured to receive external solar light 1110,1116 and the second surface for coupling diffusive light 1114,1118 out of the optical structure into the greenhouse. As will be described hereunder in more details, in some embodiment, one or more first luminescent layers $1108_{1,2}$ may be provided over the first of the substrate. Alternatively, and/or in addition, in another embodiment, one or more second luminescent layers (not shown) may be provide over the second surface of the substrate. In an embodiment, the one or more first luminescent layers may be part of a layered structured that is optimized for coupling light, in particular UV and PAR light, into the optical structure. For example, the luminescent layer may be part of thin film multi-layer anti-reflection structure that is optimized for coupling light, in particular UV and PAR light, into the optical structure. In a similar way, the one or more second luminescent layers may be optimized for coupling light out of the optical structure. A luminescent layer may be deposited (e.g. sol-gel or sputtering) directly onto the surface of the glazing. Alternatively, before depositing a luminescent layer onto the substrate one or more layers, e.g. adhesion layers, buffer layers and/or passivation layers may be deposited over the glazing.

In the embodiment of FIG. 11A, the optical structure may comprise a substantially scattering free or low-scattering luminescent thin film layer $1108_1$ and high-scattering glazing $1102_1$ (also referred to as a diffused glass pane). In an embodiment, the luminescent layer $1108_1$ may be an amorphous SiAlON:$Eu^{2+}$ thin film layer having a haze smaller than 3%, preferably smaller than 2%, more preferably smaller than 1%. The thickness of the SiAlON:$Eu^2$ thin film may be between 2000 and 10 nm, preferably between 1000 and 50 nm, more preferably between 800 and 80 nm. Such layer may be realized using sputtering or sol-gel techniques as described in this application. In a further embodiment, the luminescent layer may be a low-scattering SiAlON:$Eu^{2+}$ nanoparticle coating. Such layer may include SiAlON:$Eu^{2+}$ nanoparticles in an inorganic or organic matrix material. In an embodiment, the matrix material may be an amorphous dielectric material such as SiAlON, $Si_3N_4$, $Al_2O_3$, $Ti_2O_3$, etc. In another embodiment, the matrix material may be a transparent organic dielectric material such as PMMA, polyacrylic acid, polycarbonate, polyethylene, fiberglass. Such nano-particle coating may be realized based on suitable particle synthesis methods and coating techniques as described in this application.

The glazing $1102_1$ may include a diffused glass material. The diffusive glass material may be optimized for light transmission (in particular light transmission in the PAR region), while scattering the light in random directions when the light leaves the substrate. In an embodiment, the glazing may comprise scattering structures for scattering the light in a diffusive way. Instead of a glass substrate, a (diffused) transparent polymer-based substrate may be used, wherein the substrate is provided with light scattering structures so that diffusive light leaves optical structure on the second surface.

The optical structure depicted in FIG. 11A will receive radiation of the solar spectrum ranging from UV to IR radiation. UV light will be transformed by the divalent Eu dopants 1112 in the SiAlON layer into radiation of the PAR. The doped SiAlON layer is transparent for radiation from the visible part, including the PAR region, will be guided into the diffused glazing. The PAR light generated by the $Eu^{2+}$ doping sites 1014 and the PAR light from the solar light 1118 will exit the optical structure as diffused light, which is advantageous for plant growth.

In the embodiment of FIG. 11B, the optical structure may comprise a high-scattering luminescent thin film layer $1108_2$ and low-scattering transparent substrate $1102_2$. In an embodiment, the luminescent thin film layer may be a thin film polycrystalline SiAlON:$Eu^{2+}$ provided over a low-scattering transparent substrate, e.g. a glass substrate or a transparent polymer based substrate. In another embodiment, instead of a thin film polycrystalline SiAlON:$Eu^{2+}$ as high-scattering micro-particle based coating layer may be used. Such layer may include SiAlON:$Eu^{2+}$ micron-sized particles in an inorganic or organic matrix material. In an embodiment, the matrix material may be an amorphous dielectric material such as SiAlON, $Si_3N_4$, $Al_2O_3$, $Ti_2O_3$, etc. In another embodiment, the matrix material may be a transparent organic dielectric material such as PMMA, polyacrylic acid, polycarbonate, polyethylene, fiberglass. Such micron-particle coating may be realized based on suitable particle synthesis methods and coating techniques as described in this application.

The optical structure depicted in FIG. 11B will receive radiation of the solar spectrum ranging from UV to IR radiation, wherein UV light will be transformed by the divalent Eu dopants 1112 in the SiAlON layer into radiation of the PAR. As the SiAlON layer is a high-scattering layer, the PAR light emitted by the $Eu^{2+}$ doped material will be scattered into the low-scattering transparent substrate. Further, the doped SiAlON layer will act as a scattering layer for the visible part, including the PAR region. Hence, this part of the solar light will be scattered into the diffused substrate. The PAR light generated by the $Eu^{2+}$ doping sites 1114 and the PAR light from the solar light 1118 will exit the optical structure as diffused light, which is advantageous for plant growth.

It is submitted that the invention is not limited to the optical structures as described with reference to FIGS. 11A and 11B. For example, in a further embodiment, the optical structure may include a high-scattering luminescent thin film layer as well as a high-scattering transparent substrate. Hence, both the luminescent layer and the substrate are configured to generate diffusive light that leaves the optical structure. In such embodiment, the optical structure may be optimized for transmitting and generating highly diffused light in the PAR region when the optical structure is exposed to solar radiation.

Further, in an embodiment, instead of providing one or more luminescent layers over the first surface (or in addition to providing one or more luminescent layers over a the first surface), a low-scattering or low-scattering luminescent layer may be provided over the second surface of the transparent substrate, which deepening on the application—may either be a high-scattering (diffused) substrate or a low-scattering substrate.

FIGS. 12A and 12B depict electro-optical structures comprising a luminescent material according to various embodiments of the invention. The embodiments depicted in the figures include an optical structure that is optically coupled to a photovoltaic device for transforming part of the light in the optical structure into electrical power. The optical structure may be one of the optical structures as described with reference to some of the embodiments described in this application. The electro-optical structures may be part of a luminescent glazing structure for a greenhouse. Generally, such optical structure may include a transparent substrate $1202_{1,2}$ having a first and second surface and one or more thin film luminescent layers $1208_{1,2}$ comprising an SiAlON: $Eu^{2+}$ based luminescent material. The one or more thin film luminescent layers may be part of or covered with an anti-reflection coating as described in more detail with reference to FIGS. 6 and 7.

FIG. 12A depicts an example of an electro-optical structure wherein one or more photovoltaic cells 1210 may be optically coupled to one of the sides of the transparent substrate. The electro-optical structure may be part of a luminescent glazing structure for a greenhouse. In this particular embodiment, the optical structure formed by the transparent substrate and the one or more luminescent layers may form a light guide structure for guiding light, e.g. incoming solar light or light generated by the one or more luminescent layers, is trapped in the light guide and guided by internal reflection towards the edges of the optical structure. This light may be absorbed by the photovoltaic cells and converted into electrical power. The optical structure thus forms a luminescent solar concentrator (LSC) structure.

In an embodiment, a reflective screen 1218 that can be folded out into an expanded state so that it extends over at least part of the back surface of the optical structure. This way, the reflective screen may prevent (part of) the solar radiation from entering the greenhouse and, additionally, help to increase the trapping of light into the optical structure as illustrated in FIG. 12A. The reflective screen may be folded up (in a non-expanded state) and (partly) folded out (in an expanded state). In the non-expanded state, the UV light of the solar light that enters the optical structure via the light receiving face of the optical structure will be transformed into PAR light. A large part of the thus generated PAR light and the visible part of the solar light will be guided towards the second surface where it will leave the optical structure and enter the greenhouse. A part of the light may be trapped into the optical structure and guided towards the sides of the optical structure where it will be converted by the photovoltaic cell into electrical power. In the expanded state, the reflective screen will reflect light at the backside of the optical structure back into the optical structure thereby increasing the amount of light that is trapped into the optical structure.

FIG. 12B depicts another electro-optical structure wherein a (near)infrared photovoltaic conversion layer 1216 at least partly covers the light receiving face of an optical structure comprising a glazing structure and one or more thin film luminescent layers $1208_{1,2}$ comprising an SiAlON: $Eu^{2+}$ based luminescent material. The (near)infrared photovoltaic conversion layer 1216 may be transparent for visible light (including PAR light) and transform light from the (near)infrared part of the solar spectrum into electrical power. Examples of such NIR solar conversion devices are known in the art, see e.g. R. Lundt et al, in their article "*Transparent, near-infrared organic photovoltaic solar cells for window and energy-scavenging applications*", Applied Physics Letters, Volume 98, Issue 11, id. 113305 (3 pages) (2011).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope of the appending claims and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A luminescent greenhouse glazing structure comprising:
   a glass pane for a greenhouse; and
   one or more $Eu^{2+}$ doped amorphous inorganic luminescent thin film layers provided over the glass pane,
   wherein the one or more $Eu^{2+}$ doped amorphous inorganic luminescent layers consist of elements Al and/or Si and elements O and/or N; and have a Si concentration between 0 at. % and 45 at. %, an Al concentration between 0 at. % and 50 at. %, an O concentration between 0 at. % and 70 at. %, an N concentration between 0 at. % and 60 at. % and a $Eu^{2+}$ concentration between 0.01 at. % and 30 at. %.

2. The luminescent glazing structure according to claim 1, wherein at least one of the one or more luminescent thin film layers is an $Eu^{2+}$ doped SiAlON thin film layer having a Si concentration greater than 10 at. % to less than 45 at. %, an Al concentration greater than 2 at. % to less than 20 at. %, an O concentration greater than 30 at. % to less than 70 at. %, an N concentration greater than 0 at. % to less than 31 at. % and a $Eu^{2+}$ concentration greater than 0.05 at. % to less than 8 at. %.

3. The luminescent glazing structure according to claim 1, wherein at least one of the one or more luminescent layers is an $Eu^{2+}$ doped SiAlON thin film layer, the composition of the $Eu^{2+}$ doped SiAlON thin film layer including Si at 38.4 at. %; Al at 3.7 at. %; O at 41.1 at. %; N at 16.3 at. %; $Eu^{2+}$ at 0.5 at. %, and atomic percentages of the individual elements Si, Al, O, N and $Eu^{2+}$ may vary +/−10%.

4. The luminescent greenhouse glazing structure according to claim 1, wherein a thickness of the $Eu^{2+}$ doped SiAlON thin film layer is between 10 nm and 2000 nm.

5. The luminescent greenhouse glazing structure according to claim 1, wherein the luminescent glazing structure has a length between 100 cm and 300 cm, a width between 40 cm and 200 cm and a thickness between 3 mm and 6 mm.

6. The luminescent glazing structure according to claim 1, further comprising a thin film anti-reflection structure provided over the one or more luminescent thin film layers, for coupling light into the glass pane.

7. The luminescent glazing structure according to claim 6, wherein the thin-film anti-reflection structure includes at least one thin film of a porous oxide material.

8. The luminescent glazing structure according to claim 6, wherein the thin film anti-reflection structure comprises a stack of dielectric thin film layers, the stack of dielectric thin film layers including one or more first layers of a first dielectric material having a first refractive index and one or more second layers of a second dielectric material having a second refractive index, the second refractive index being higher than the first refractive index.

9. The luminescent glazing structure according to claim 1, wherein at least part of the one or more luminescent thin film layers is part of a thin film anti-reflection structure for coupling light into the glazing structure.

10. The luminescent glazing structure according to claim 8,
    wherein at least part of the one or more first layers includes a low-refractive index $Eu^{2+}$ doped SiAlON layer; and/or,
    at least part of the one or more second layers includes a high-refractive index $Eu^{2+}$ doped SiAlON layer; and/or,
    at least part of the one or more second layers includes a high-refractive index non-doped SiAlON layer.

11. The luminescent glazing structure according to claim 1, wherein the glass pane comprises a first top surface and a second bottom surface, the one or more $Eu^{2+}$ doped amorphous inorganic luminescent thin film layers being provided over the first top surface, and the first top surface is textured with a surface texture for providing a light scattering interface between the glass pane and the one or more $Eu^{2+}$ doped amorphous inorganic luminescent thin film layers.

12. The luminescent glazing structure according to claim 1, wherein the one or more thin film layers include a top surface for receiving solar light, the top surface comprising a surface texture for providing a light scattering interface.

13. The luminescent glazing structure according to claim 11, wherein the surface texture includes patterned cones, pyramids and/or microlenses with average dimensions between 10 nm and 1000 nm or between 1 and 1000 micrometer or wherein the texture features are semi-random texture features with dimensions i with average dimensions between 10 nm and 1000 nm or between 1 and 1000 micrometer.

14. The luminescent glazing structure according to claim 1, wherein the at least one transparent substrate is a diffused transparent substrate having a high haze factor larger than 70%; and/or the luminescent layer has a low haze factor smaller than 20%.

15. A greenhouse comprising the luminescent glazing structure according to claim 1.

16. The luminescent glazing structure according to claim 2, wherein the Si concentration is between-greater than 20 at. % to less than 45 at. %, the Al concentration is between greater than 2 at. % to less than 10 at. %, the O concentration is greater than 30 at. % to less than 60 at. %, the N concentration is greater than 0 at. % to less than 31 at. % and the $Eu^{2+}$ concentration is greater than 0.1 at. % to less than 4 at. %.

17. The luminescent glazing structure according to claim 4, wherein the thickness of the $Eu^{2+}$ doped SiAlON thin film layer is between 40 nm and 400 nm.

18. The luminescent glazing structure according to claim 10, wherein at least part of the one or more first layers includes a low-refractive index $Eu^{2+}$ doped $SiO_2$ layer doped with $Al^{3+}$, $N^{3+}$ and $Eu^{2+}$ or a SiAlO layer doped with $Eu^{2+}$; and/or,
    at least part of the one or more second layers includes a high-refractive index doped AlN layer doped with $Si^{4+}$, $O^{2+}$ and $Eu^{2+}$ or a SiAlN layer doped with $Eu^{2+}$; and/or,
    at least part of the one or more second layers includes a high-refractive index non-doped AlN layer or a non-doped SiAlN layer.

19. The luminescent glazing structure according to claim 11, wherein the surface texture has a standard deviation of a Gaussian scattering distribution at the light scattering interface of 20 degrees or more.

20. The luminescent glazing structure according to claim 14, wherein the haze factor of the at least one transparent substrate is larger than 90% and/or the haze factor of the luminescent layer is smaller than 2%.

21. A luminescent greenhouse glazing structure comprising:
 a glass pane for a greenhouse; and
 one or more $Eu^{2+}$ doped amorphous inorganic luminescent thin film layers provided over the glass pane,
 wherein the one or more $Eu^{2+}$ doped amorphous inorganic luminescent layers comprises elements Al and/or Si and elements O and/or N; and have a Si concentration greater than 0 at. % to less than 45 at. %, an Al concentration greater than 0 at. % to less than 50 at. %, an O concentration greater than 0 at. % to less than 70 at. %, an N concentration greater than 0 at. % to less than 60 at. % to less than a $Eu^{2+}$ concentration greater than 0.01 at. % to less than 30 at. %,
 the glass pane comprises a first top surface and a second bottom surface, the one or more $Eu^{2+}$ doped amorphous inorganic luminescent thin film layers being provided over the first top surface, and the first top surface is textured with a surface texture for providing a light scattering interface between the glass pane and the one or more $Eu^{2+}$ doped amorphous inorganic luminescent thin film layers, and
 the surface texture includes texture features selected from the group consisting of patterned cones, pyramids and/or microlenses with average dimensions greater than 10 nm and 1000 nm, or the texture features are semi-random texture features with dimensions i with average dimensions greater than 10 nm and 1000 nm.

22. A luminescent greenhouse glazing structure comprising:
 a glass pane for a greenhouse;
 one or more $Eu^{2+}$ doped amorphous inorganic luminescent thin film layers provided over the glass pane, and
 a thin film anti-reflection structure provided over the one or more luminescent thin film layers, for coupling light into the glass pane;
 wherein the one or more $Eu^{2+}$ doped amorphous inorganic luminescent layers comprises elements Al and/or Si and elements O and/or N; and have a Si concentration greater than 0 at. % to less than 45 at. %, an Al concentration greater than 0 at. % to less than 50 at. %, an O concentration greater than 0 at. % to less than 70 at. %, an N concentration greater than 0 at. % to less than 60 at. % to less than a $Eu^{2+}$ concentration greater than 0.01 at. % to less than 30 at. %,
 the thin film anti-reflection structure comprises a stack of dielectric thin film layers, the stack of dielectric thin film layers including one or more first layers of a first dielectric material having a first refractive index and one or more second layers of a second dielectric material having a second refractive index, the second refractive index being higher than the first refractive index,
 at least part of the one or more first layers includes a low-refractive index $Eu^{2+}$ doped SiAlON layer; and/or,
 at least part of the one or more second layers includes a high-refractive index $Eu^{2+}$ doped SiAlON layer; and/or,
 at least part of the one or more second layers includes a high-refractive index non-doped SiAlON layer, and
 at least part of the one or more first layers includes a low-refractive index $Eu^{2+}$ doped $SiO_2$ layer doped with $Al^{3+}$, $N^{3+}$ and $Eu^{2+}$ or a SiAlO layer doped with $Eu^{2+}$; and/or,
 at least part of the one or more second layers includes a high-refractive index doped AlN layer doped with $Si^{4+}$, $O^{2+}$ and $Eu^{2+}$ or a SiAlN layer doped with $Eu^{2+}$; and/or,
 at least part of the one or more second layers includes a high-refractive index non-doped AlN layer or a non-doped SiAlN layer.

23. A luminescent greenhouse glazing structure comprising:
 a glass pane for a greenhouse; and
 one or more $Eu^{2+}$ doped amorphous inorganic luminescent thin film layers provided over the glass pane,
 wherein the one or more $Eu^{2+}$ doped amorphous inorganic luminescent layers comprises elements Al and/or Si and elements O and/or N; and have a Si concentration greater than 0 at. % to less than 45 at. %, an Al concentration greater than 0 at. % to less than 50 at. %, an O concentration greater than 0 at. % to less than 70 at. %, an N concentration greater than 0 at. % to less than 60 at. % to less than a $Eu^{2+}$ concentration greater than 0.01 at. % to less than 30 at. %,
 the glass pane comprises a first top surface and a second bottom surface, the one or more $Eu^{2+}$ doped amorphous inorganic luminescent thin film layers being provided over the first top surface, and the first top surface is textured with a surface texture for providing a light scattering interface between the glass pane and the one or more $Eu^{2+}$ doped amorphous inorganic luminescent thin film layers, and
 the surface texture has a standard deviation of a Gaussian scattering distribution at the light scattering interface of 20 degrees or more.

* * * * *